US012099921B2

United States Patent
Tran et al.

(10) Patent No.: US 12,099,921 B2
(45) Date of Patent: Sep. 24, 2024

(54) DECODERS FOR ANALOG NEURAL MEMORY IN DEEP LEARNING ARTIFICIAL NEURAL NETWORK

(71) Applicant: Silicon Storage Technology, Inc., San Jose, CA (US)

(72) Inventors: Hieu Van Tran, San Jose, CA (US); Stanley Hong, San Jose, CA (US); Anh Ly, San Jose, CA (US); Thuan Vu, San Jose, CA (US); Hien Pham, Ho Chi Minh (VN); Kha Nguyen, Ho Chi Minh (VN); Han Tran, Ho Chi Minh (VN)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 402 days.

(21) Appl. No.: 17/367,633

(22) Filed: Jul. 6, 2021

(65) Prior Publication Data

US 2021/0342682 A1    Nov. 4, 2021

Related U.S. Application Data

(62) Division of application No. 15/991,890, filed on May 29, 2018, now Pat. No. 11,087,207.

(60) Provisional application No. 62/642,884, filed on Mar. 14, 2018.

(51) Int. Cl.
*G06N 3/065* (2023.01)
*G06F 17/16* (2006.01)
*G06N 3/04* (2023.01)

(52) U.S. Cl.
CPC .............. *G06N 3/065* (2023.01); *G06F 17/16* (2013.01); *G06N 3/04* (2013.01)

(58) Field of Classification Search
CPC ........... G06F 17/16; G06N 3/04; G06N 3/065
See application file for complete search history.

(56) References Cited

U.S. PATENT DOCUMENTS

| 4,810,910 A | 3/1989 | Schoellikopf et al. |
| 4,961,002 A | 10/1990 | Tam |
| 5,029,130 A | 7/1991 | Yeh |
| 5,097,441 A | 3/1992 | Soo-In |

(Continued)

FOREIGN PATENT DOCUMENTS

| CN | 1689115 A | 10/2005 |
| CN | 105321570 A | 2/2016 |

(Continued)

OTHER PUBLICATIONS

U.S. Appl. No. 16/382,013 entitled "Neural Network Classifier Using Array of Two-Gate Non-volatile Memory Cells," Tran et al., filed on Apr. 11, 2019.

(Continued)

*Primary Examiner* — Michael D. Yaary
(74) *Attorney, Agent, or Firm* — DLA PIPER LLP US

(57) ABSTRACT

Numerous embodiments of decoders for use with a vector-by-matrix multiplication (VMM) array in an artificial neural network are disclosed. The decoders include bit line decoders, word line decoders, control gate decoders, source line decoders, and erase gate decoders. In certain embodiments, a high voltage version and a low voltage version of a decoder is used.

17 Claims, 45 Drawing Sheets

(56) References Cited

U.S. PATENT DOCUMENTS

| | | |
|---|---|---|
| 5,138,576 A | 8/1992 | Madurawe |
| 5,146,602 A | 9/1992 | Holler |
| 5,256,911 A | 10/1993 | Holler |
| 5,264,734 A | 11/1993 | Holler |
| 5,336,936 A | 8/1994 | Allen et al. |
| 5,386,132 A | 1/1995 | Wong |
| 5,469,397 A | 11/1995 | Hoshino |
| 5,554,874 A | 9/1996 | Doluca |
| 5,621,336 A | 4/1997 | Shibata et al. |
| 5,643,814 A | 7/1997 | Chung |
| 5,721,702 A | 2/1998 | Briner |
| 5,914,894 A | 6/1999 | Diorio |
| 6,222,777 B1 | 4/2001 | Khieu |
| 6,301,158 B1 | 10/2001 | Iwasashi |
| 6,683,645 B1 | 1/2004 | Collins |
| 6,747,310 B2 | 6/2004 | Fan et al. |
| 6,829,598 B2 | 12/2004 | Milev |
| 7,315,056 B2 | 1/2008 | Klinger et al. |
| 7,868,375 B2 | 1/2011 | Liu et al. |
| 10,970,441 B1 * | 4/2021 | Zhang .................. G06N 3/063 |
| 2002/0089014 A1 | 7/2002 | Chern |
| 2003/0034510 A1 | 2/2003 | Liu |
| 2003/0183871 A1 | 10/2003 | Dugger |
| 2004/0095809 A1 | 5/2004 | Sakamoto |
| 2004/0125655 A1 | 7/2004 | Tsai |
| 2004/0156241 A1 | 8/2004 | Mokhlesi |
| 2005/0087892 A1 | 4/2005 | Hsu |
| 2005/0213385 A1 | 9/2005 | Hosono |
| 2006/0104120 A1 | 5/2006 | Hemink |
| 2006/0170038 A1 | 8/2006 | Wong |
| 2007/0171756 A1 | 7/2007 | Lambrache |
| 2009/0103361 A1 | 4/2009 | Wang |
| 2009/0109760 A1 | 4/2009 | Nazarian |
| 2010/0046299 A1 | 2/2010 | Roohparvar |
| 2010/0287440 A1 | 11/2010 | Alrod |
| 2010/0290292 A1 | 11/2010 | Tanizaki |
| 2012/0087188 A1 | 4/2012 | Hsieh et al. |
| 2013/0044544 A1 | 2/2013 | Shiino |
| 2013/0100756 A1 | 4/2013 | Liao et al. |
| 2014/0054667 A1 | 2/2014 | Tkachev |
| 2014/0269062 A1 | 9/2014 | Do |
| 2014/0310220 A1 | 10/2014 | Chang |
| 2015/0106315 A1 | 4/2015 | Birdwell |
| 2015/0213898 A1 | 7/2015 | Do |
| 2015/0262055 A1 | 9/2015 | Akopyan |
| 2016/0042790 A1 | 2/2016 | Tran |
| 2016/0093382 A1 | 3/2016 | Sakamoto |
| 2016/0133639 A1 | 5/2016 | Tran |
| 2016/0180945 A1 | 6/2016 | Ng |
| 2016/0254269 A1 | 9/2016 | Kim et al. |
| 2016/0365147 A1 | 12/2016 | Georgescu |
| 2017/0117291 A1 | 4/2017 | Or-Bach |
| 2017/0337466 A1 | 11/2017 | Bayat |
| 2017/0337971 A1 | 11/2017 | Tran et al. |
| 2017/0337980 A1 | 11/2017 | Guo et al. |
| 2018/0004708 A1 | 1/2018 | Muralimanohar |
| 2018/0268912 A1 | 9/2018 | Guo et al. |
| 2018/0293487 A1 | 10/2018 | Copel |
| 2018/0350823 A1 * | 12/2018 | Or-Bach ................ G11C 16/10 |
| 2019/0088325 A1 | 3/2019 | Tiwari |
| 2019/0237136 A1 | 8/2019 | Tran |
| 2019/0237142 A1 | 8/2019 | Tran |

FOREIGN PATENT DOCUMENTS

| | | |
|---|---|---|
| EP | 0566739 A1 | 10/1993 |
| EP | 0562737 B1 | 6/1998 |
| JP | H03-018985 A | 1/1991 |
| JP | 3 174679 | 6/2001 |

OTHER PUBLICATIONS

U.S. Appl. No. 16/382,034 entitled "Neural Network Classifier Using Array of Four-Gate Non-volatile Memory Cells," Tran, et al., filed on Apr. 11, 2019.

U.S. Appl. No. 16/382,045 entitled "Neural Network Classifier Using Array of Three-Gate Non-volatile Memory Cells," Tran, et al., filed on Apr. 11, 2019.

U.S. Appl. No. 16/382,051 entitled "Neural Network Classifier Using Array of Stacked Gate Non-volatile Memory Cells," Tran, et al., filed on Apr. 11, 2019.

U.S. Appl. No. 16/382,060 entitled "Memory Device and Method for Varying Program State Separation Based Upon Frequency of Use," Tran, et al., filed on Apr. 11, 2019.

U.S. Appl. No. 15/826,345 entitled "High Precision and Highly Efficient Tuning Mechanisms . . . Network," Tran, et al., filed on Nov. 29, 2017.

U.S. Appl. No. 16/271,673 entitled "Flash Memory Array With Individual Memory Cell Read, Program and Erase," Guo et al., filed on Feb. 8, 2019.

U.S. Appl. No. 15/991,890 entitled "Decoders for Analog Neural Memory In Deep Learning Artificial Neural Network," Tran, et al., filed on May 29, 2018.

U.S. Appl. No. 16/353,830 entitled "System for Converting Neuron Current Into Neuron Current-Based Time Pulses . . . Network," Tran et al., filed on Mar. 14, 2019.

U.S. Appl. No. 16/353,409, titled "Apparatus and Method for Combining Analog Neural Net With FPGA Routing in a Monolithic Integrated Circuit," filed on Mar. 14, 2019.

U.S. Appl. No. 62/797,158, titled "Apparatus and Method for Combining Analog Neural Net With FPGA Routing in a Monolithic Integrated Circuit," filed on Jan. 25, 2019.

Jenn-Chyou Bor, et al., "Realization of the CMOS Pulsewidth-Modulation (PWM) Neural Network with On-Chip Learning," IEEE Transactions on Circuits and Systems, Jan. 1998.

Alister Hamilton, et al., "Integrated Pulse Stream Neural Networks: Results, Issues, and Pointers," IEEE Transactions on Neural Networks, May 1992.

Shafiee et al.,"Isaac: A Convolutional Neural Network Accelerator With In-Situ Analog Arithmetic in Crossbars;" 2016 ACM/IEEE 43rd Annual International Symposium on Computer Architecture, Seoul, Oct. 2016. [URL:https://www.cs.utah.edu/-rajeev/pubs/isca16.pdf; pp. 1-4.].

Notice of Reasons for Refusal mailed on Nov. 22, 2022 corresponding to the related Japanese Patent Application No. 2020-548740.

European Search Report mailed Mar. 12, 2024 corresponding to the related European Patent Application No. 23212305.9.

Chinese Office Action issued on Feb. 27, 2024 corresponding to the related Chinese Patent Application No. 201980018434.5.

S. Korean Office Action mailed on Feb. 20, 2024 corresponding to the related S. Korean Patent Application No. 10-2023-7039451.

Japanese Office Action mailed on Apr. 16, 2024 corresponding to the related Japanese Patent Application No. 2023-049721.

* cited by examiner

FIGURE 42

|          | WL     | WL-unsel | BL                  | BL-unsel     | SL    | SL-unsel  |
|----------|--------|----------|---------------------|--------------|-------|-----------|
| Read     | 1-3.5V | -0.5V/0V | 0.6-2V (Ineuron)    | 0.6V-2V/0V   | 0V    | 0V        |
| Erase    | ~5-13V | 0V       | 0V                  | 0V           | 0V    | 0V        |
| Program  | 1-2V   | -0.5V/0V | 0.1-3 uA            | Vinh ~2.5V   | 4-10V | 0-1V/FLT  |

FIGURE 43

|         | WL       | WL-unsel  | BL       | BL-unsel    | SL              | SL-unsel          |
|---------|----------|-----------|----------|-------------|-----------------|-------------------|
| Read    | 1-3.5V   | -0.5V/0V  | 0.6-2V   | 0.6V-2V/0V  | ~1V (Ineuron)   | 0V                |
| Erase   | ~5-13V   | 0V        | 0V       | 0V          | 0V              | SL-inhibit (~4-8V) |
| Program | 1-2V     | -0.5V/0V  | 0.1-3 uA | Vinh ~2.5V  | 4-10V           | 0-1V/FLT          |

FIGURE 44

| | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2V | -0.5V/ 0V | 0.6-2V (Ineuron) | 0V | 0-2.6V | 0-2.6V | 0-2.6V | 0-2.6V | 0-2.6V | 0V | 0V |
| Erase | 0V | 0V | 0V | 0V | 0V | 0-2.6V | 0-2.6V | 5-12V | 0-2.6V | 0V | 0V |
| Program | 0.7-1V | -0.5V/ 0V | 0.1-1uA | Vinh (1-2V) | 4-11V | 0-2.6V | 0-2.6V | 4.5-5V | 0-2.6V | 4.5-5V | 0-1V |

FIGURE 45

| | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2V | -0.5V/ 0V | 0.6-2V (Ineuron) | 0V | 0-2.6V | 0-2.6V | 0-2.6V | 0-2.6V | 0-2.6V | 0V | 0V |
| Erase | 0V | 0V | 0V | 0V | 0V | CGINH (4-9V) | 0-2.6V | 5-12V | 0-2.6V | 0V | 0V |
| Program | 0.7-1V | -0.5V/ 0V | 0.1-1uA | Vinh (1-2V) | 4-11V | 0-2.6V | 0-2.6V | 4.5-5V | 0-2.6V | 4.5-5V | 0-1V |

DECODERS FOR ANALOG NEURAL MEMORY IN DEEP LEARNING ARTIFICIAL NEURAL NETWORK

PRIORITY CLAIM

This application is a divisional of U.S. patent application Ser. No. 15/991,890, filed on May 29, 2018, and titled, "Decoders for Analog Neural Memory In Deep Learning Artificial Neural Network," which claims priority to U.S. Provisional Patent Application No. 62/642,884, filed on Mar. 14, 2018, and titled, "Decoders for Analog Neuromorphic Memory in Artificial Neural Network," both of which are incorporated by reference herein.

FIELD OF THE INVENTION

Numerous embodiments of decoders for use with a vector-by-matrix multiplication (VMM) array in an artificial neural network are disclosed.

BACKGROUND OF THE INVENTION

Artificial neural networks mimic biological neural networks (the central nervous systems of animals, in particular the brain) which are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows, and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, which is incorporated by reference. The non-volatile memory arrays operate as analog neuromorphic memory. The neural network device includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs.

Each non-volatile memory cells used in the analog neuromorphic memory system must be erased and programmed to hold a very specific and precise amount of charge in the floating gate. For example, each floating gate must hold one of N different values, where N is the number of different weights that can be indicated by each cell. Examples of N include 16, 32, and 64.

Prior art decoding circuits (such as bit line decoders, word line decoders, control gate decoders, source line decoders, and erase gate decoders) used in conventional flash memory arrays are not suitable for use with a VMM in an analog neuromorphic memory system. One reason for this is that in a VMM system, the verify portion (which is a read operation) of a program and verify operation operates on a single selected memory cell, whereas a read operation operates on all memory cells in the array.

What is needed are improved decoding circuits suitable for use with a VMM in an analog neuromorphic memory system.

SUMMARY OF THE INVENTION

Numerous embodiments of decoders for use with a vector-by-matrix multiplication (VMM) array in an artificial neural network are disclosed.

BRIEF DESCRIPTION OF THE DRAWINGS

FIG. 42 depicts operating voltages for the vector multiplier matrix of FIG. 9.

FIG. 43 depicts operating voltages for the vector multiplier matrix of FIG. 10.

FIG. 44 depicts operating voltages for the vector multiplier matrix of FIG. 11.

FIG. 45 depicts operating voltages for the vector multiplier matrix of FIG. 12.

DETAILED DESCRIPTION OF THE INVENTION

The artificial neural networks of the present invention utilize a combination of CMOS technology and non-volatile memory arrays.

Non-Volatile Memory Cells

Figure 1:
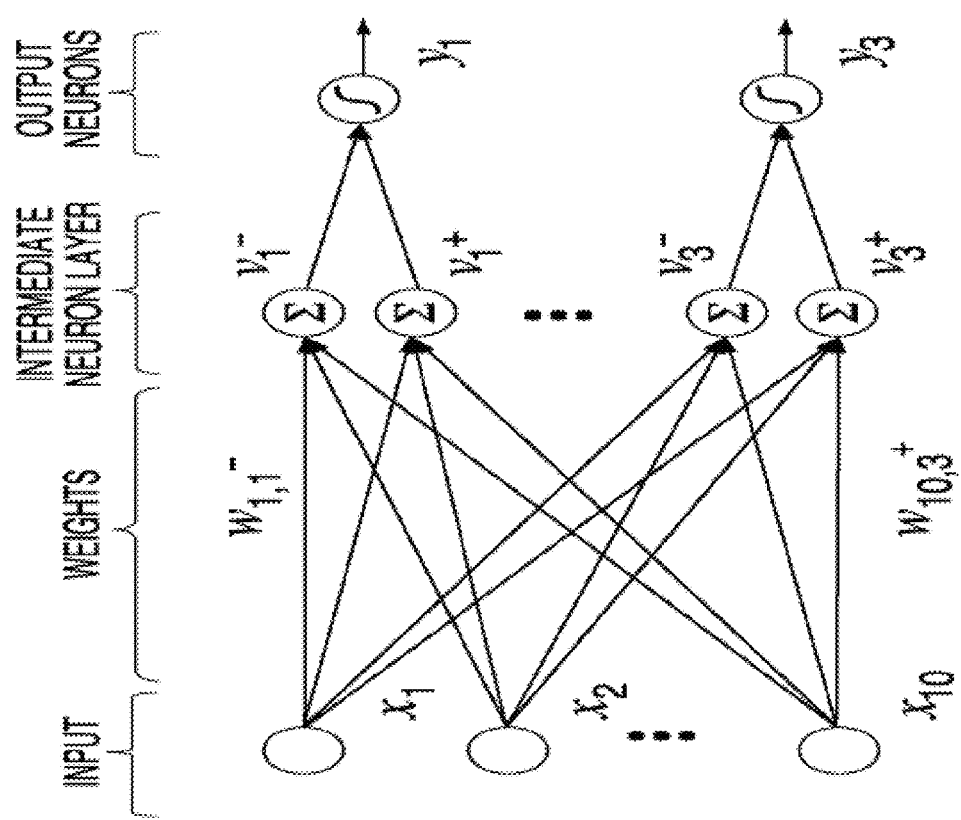
FIG. 1 is a diagram that illustrates an artificial neural network.
Figure 2:
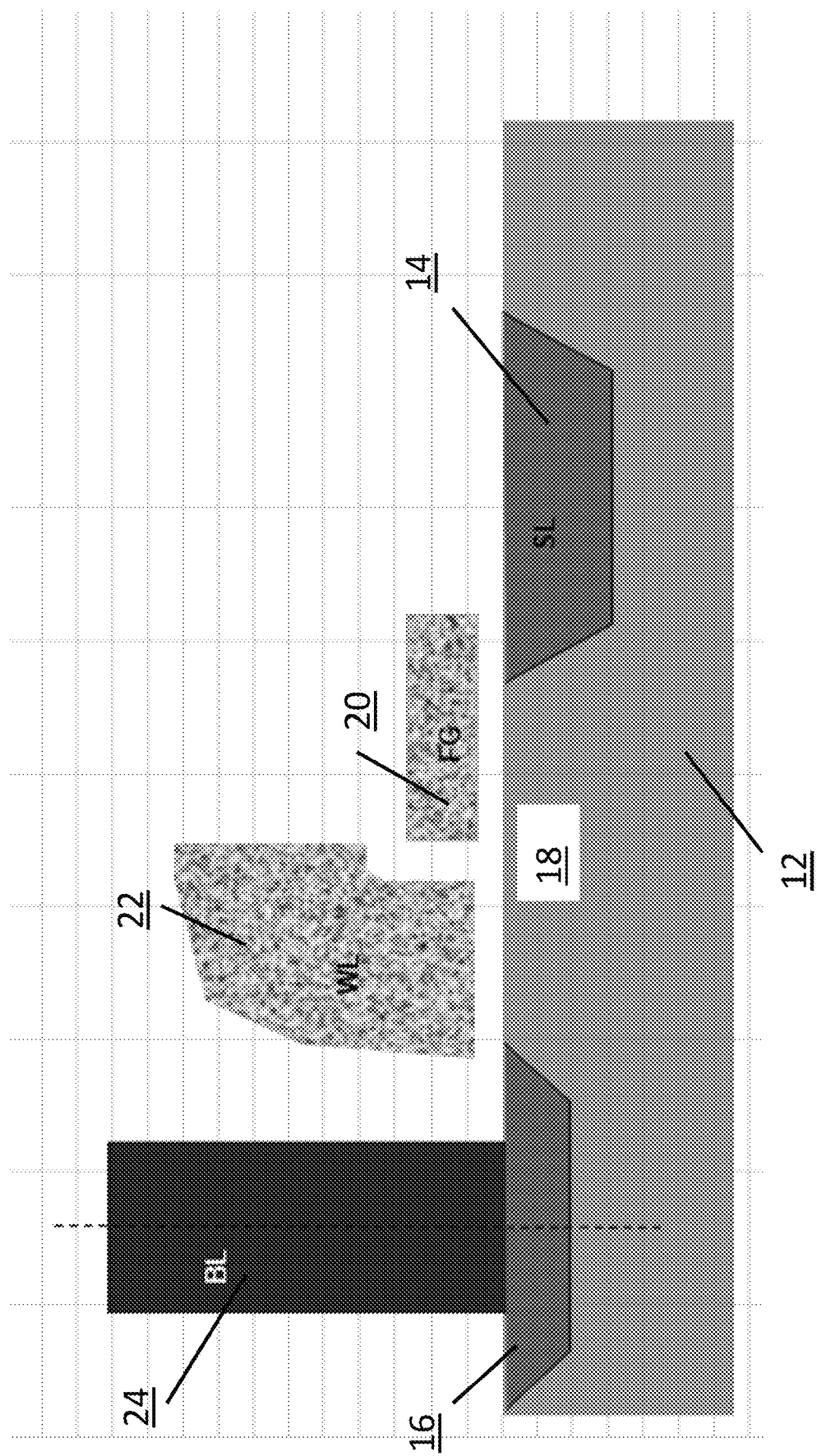
FIG. 2 is a cross-sectional side view of a conventional 2-gate non-volatile memory cell.

Digital non-volatile memories are well known. For example, U.S. Pat. No. 5,029,130 ("the '130 patent") discloses an array of split gate non-volatile memory cells, and is incorporated herein by reference for all purposes. Such a memory cell is shown in FIG. 2. Each memory cell 210 includes source region 14 and drain region 16 formed in a semiconductor substrate 12, with a channel region 18 there between. A floating gate 20 is formed over and insulated from (and controls the conductivity of) a first portion of the channel region 18, and over a portion of the source region 16. A word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source 16. Electron current will flow from the source 16 towards the drain 14. The electrons will accelerate and become heated when they reach the gap between the word line terminal 22 and the floating gate 20. Some of the heated electrons will be injected through the gate oxide 26 onto the floating gate 20 due to the attractive electrostatic force from the floating gate 20.

Memory cell 210 is read by placing positive read voltages on the drain 14 and word line terminal 22 (which turns on the channel region under the word line terminal). If the floating gate 20 is positively charged (i.e. erased of electrons and positively coupled to the drain 16), then the portion of the channel region under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 210 for performing read, erase, and program operations:

TABLE No. 1

| Operation of Flash Memory Cell 210 of FIG. 2 | | | |
|---|---|---|---|
| | WL | BL | SL |
| Read | 2-3 V | 0.6-2 V | 0 V |
| Erase | ~11-13 V | 0 V | 0 V |
| Program | 1-2 V | 1-3 µA | 9-10 V |

Figure 3:
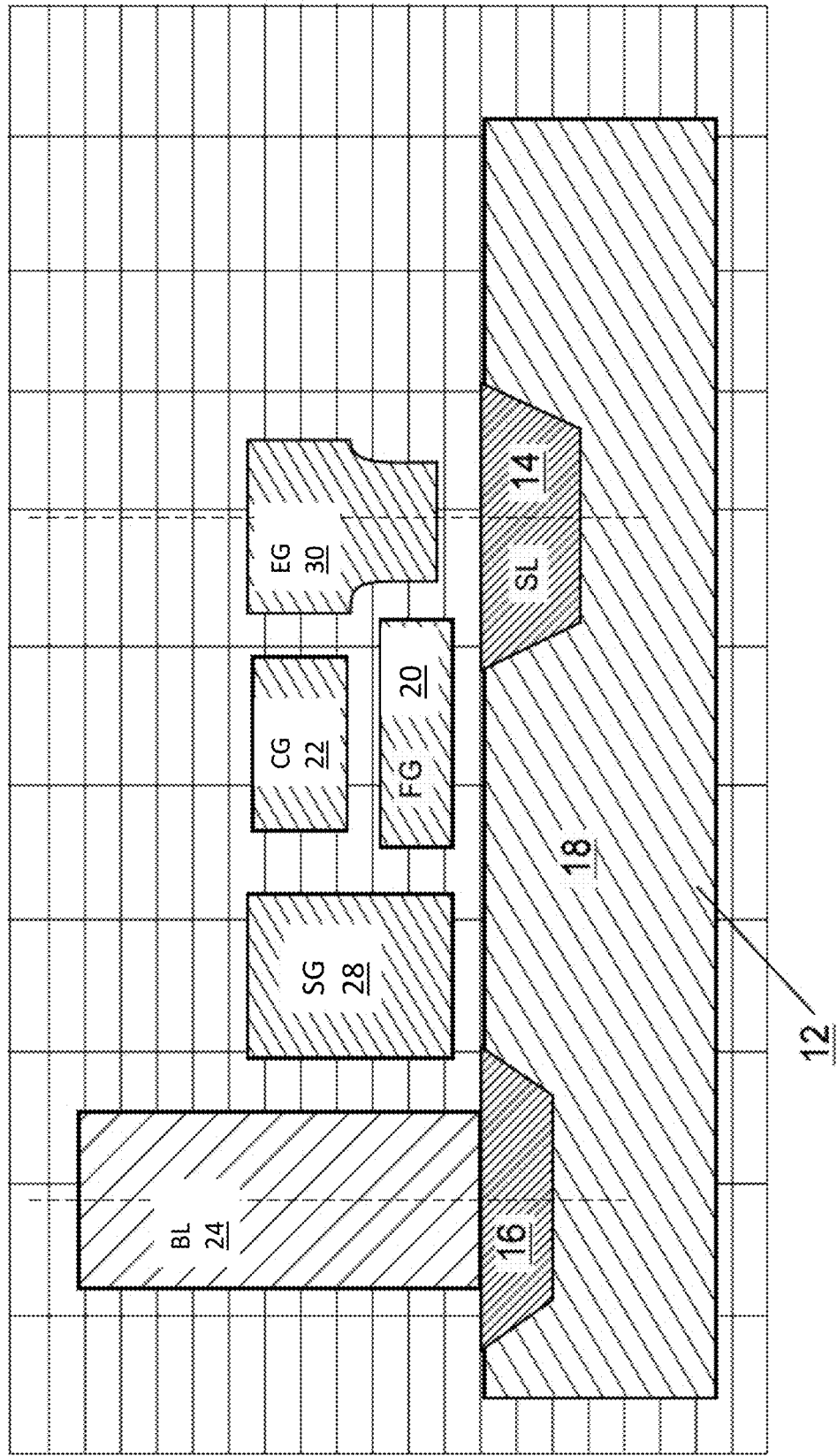
FIG. 3 is a cross-sectional side view of a conventional 4-gate non-volatile memory cell.

Other split gate memory cell configurations are known. For example, FIG. 3 depicts four-gate memory cell 310 comprising source region 14, drain region 16, floating gate 20 over a first portion of channel region 18, a select gate 28 (typically coupled to a word line) over a second portion of the channel region 18, a control gate 22 over the floating gate 20, and an erase gate 30 over the source region 14. This configuration is described in U.S. Pat. No. 6,747,310, which is incorporated herein by reference for all purposes). Here, all gates are non-floating gates except floating gate 20, meaning that they are electrically connected or connectable to a voltage source. Programming is shown by heated electrons from the channel region 18 injecting themselves onto the floating gate 20. Erasing is shown by electrons tunneling from the floating gate 20 to the erase gate 30.

Table No. 2 depicts typical voltage ranges that can be applied to the terminals of memory cell 310 for performing read, erase, and program operations:

TABLE No. 2

Operation of Flash Memory Cell 310 of FIG. 3

|  | WL/SG | BL | CG | EG | SL |
|---|---|---|---|---|---|
| Read | 1.0-2 V | 0.6-2 V | 0-2.6 V | 0-2.6 V | 0 V |
| Erase | −0.5 V/0 V | 0 V | 0 V/−8 V | 8-12 V | 0 V |
| Program | 1 V | 1 µA | 8-11 V | 4.5-9 V | 4.5-5 V |

Figure 4:
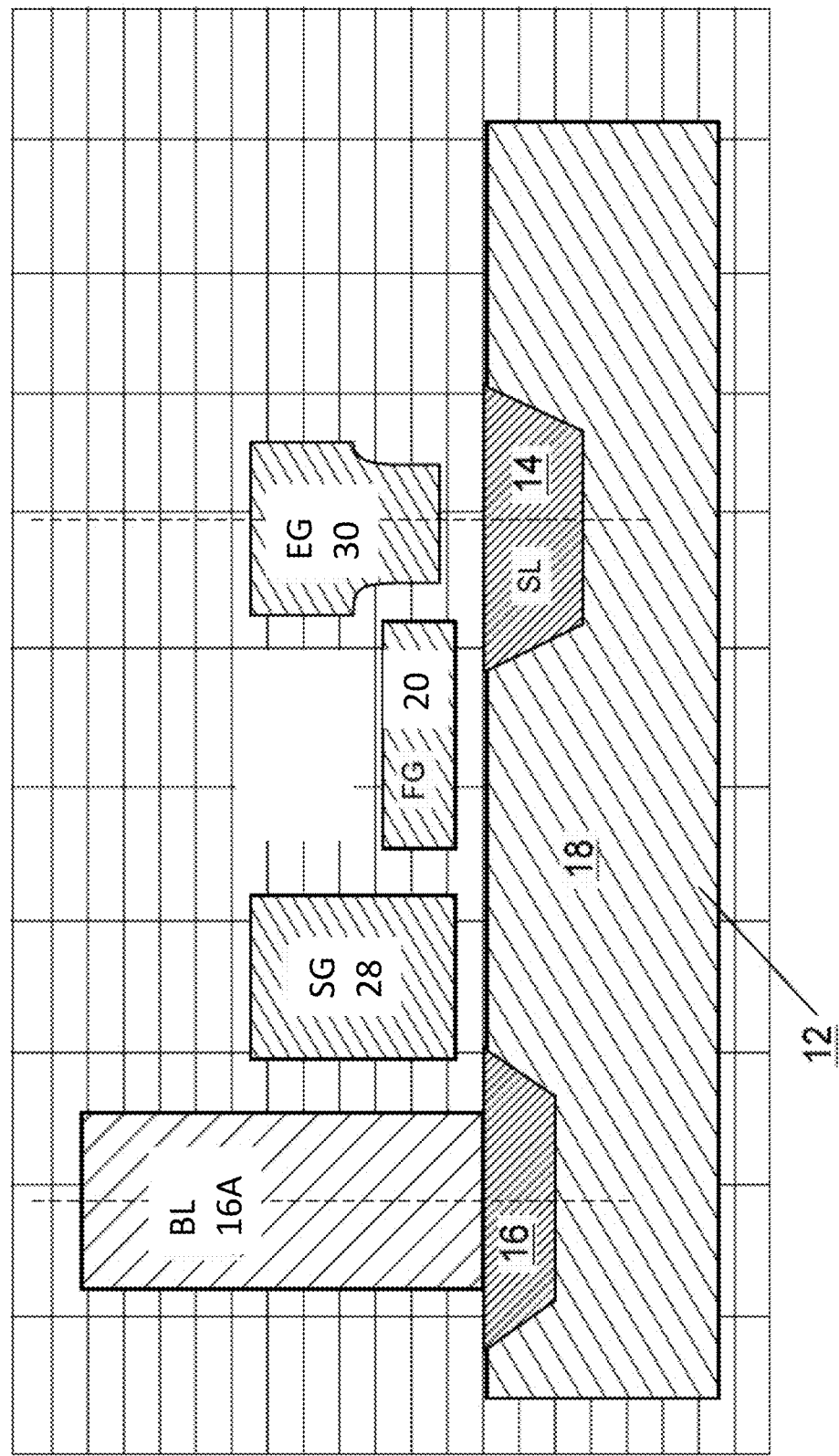
FIG. 4 is a side cross-sectional side view of conventional 3-gate non-volatile memory cell.

FIG. 4 depicts split gate three-gate memory cell 410. Memory cell 410 is identical to the memory cell 310 of FIG. 3 except that memory cell 410 does not have a separate control gate. The erase operation (erasing through erase gate) and read operation are similar to that of the FIG. 3 except there is no control gate bias. The programming operation also is done without the control gate bias, hence the program voltage on the source line is higher to compensate for lack of control gate bias.

Table No. 3 depicts typical voltage ranges that can be applied to the terminals of memory cell 410 for performing read, erase, and program operations:

TABLE No. 3

Operation of Flash Memory Cell 410 of FIG. 4

|  | WL/SG | BL | EG | SL |
|---|---|---|---|---|
| Read | 0.7-2.2 V | 0.6-2 V | 0-2.6 V | 0 V |
| Erase | −0.5 V/0 V | 0 V | 11.5 V | 0 V |
| Program | 1 V | 2-3 µA | 4.5 V | 7-9 V |

Figure 5:
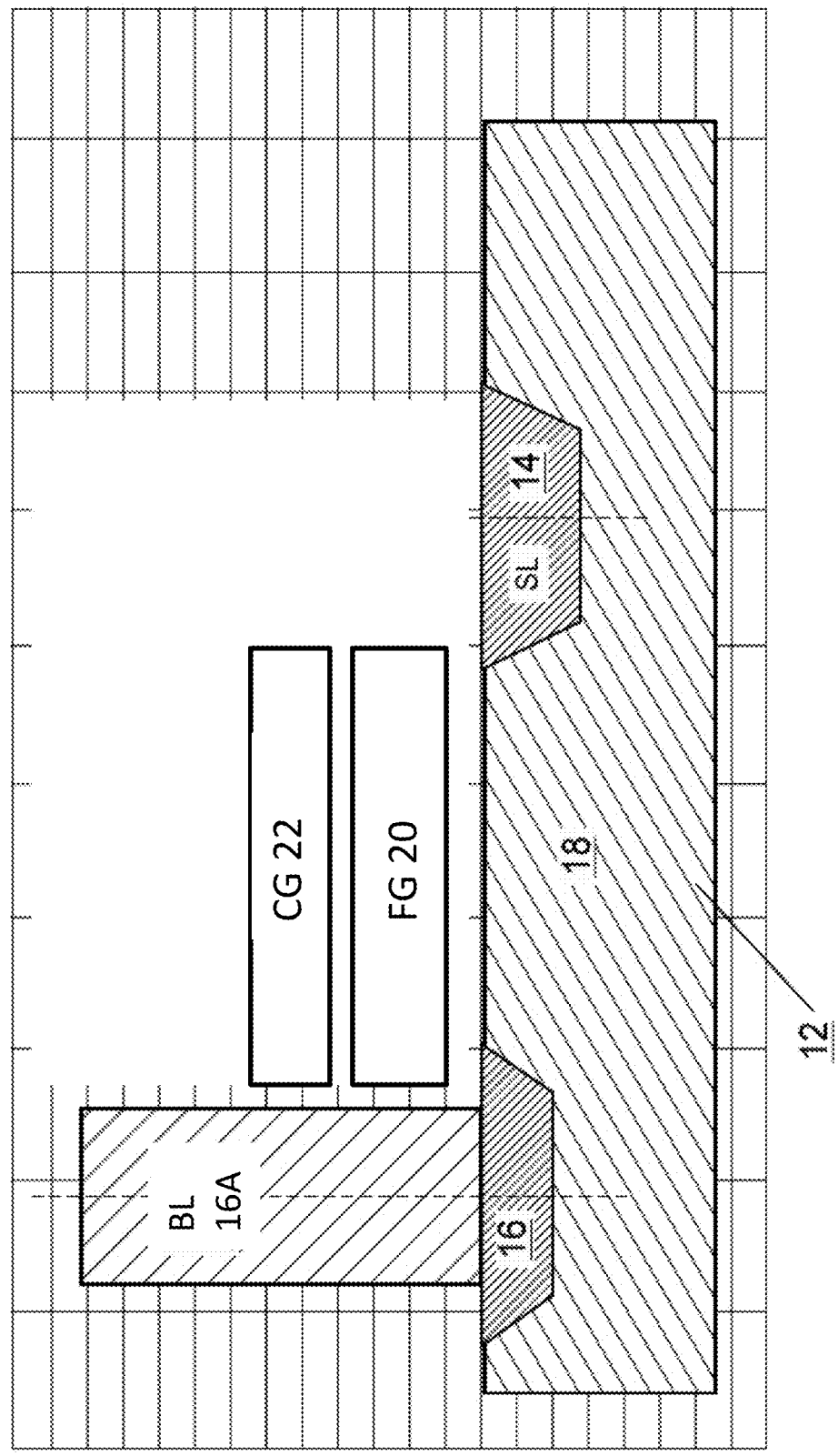
FIG. 5 is a cross-sectional side view of another conventional 2-gate non-volatile memory cell.

FIG. 5 depicts stacked gate memory cell 510. Memory cell 510 is similar to memory cell 210 of FIG. 2, except floating gate 20 extends over the entire channel region 18, and control gate 22 extends over floating gate 20, separated by an insulating layer. The erase, programming, and read operations operate in a similar manner to that described previously for memory cell 210.

Table No. 4 depicts typical voltage ranges that can be applied to the terminals of memory cell 510 for performing read, erase, and program operations:

TABLE No. 4

Operations of Flash Memory Cell 510 of FIG. 5

|  | CG | BL | SL | P-sub |
|---|---|---|---|---|
| Read | 2-5 V | 0.6-2 V | 0 V | 0 V |
| Erase | −8 to −10 V/0 V | FLT | FLT | 8-10 V/ 15-20 V |
| Program | 8-12 V | 3-5 V | 0 V | 0 V |

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cells in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

Neural Networks Employing Non-Volatile Memory Cell Arrays

Figure 6:
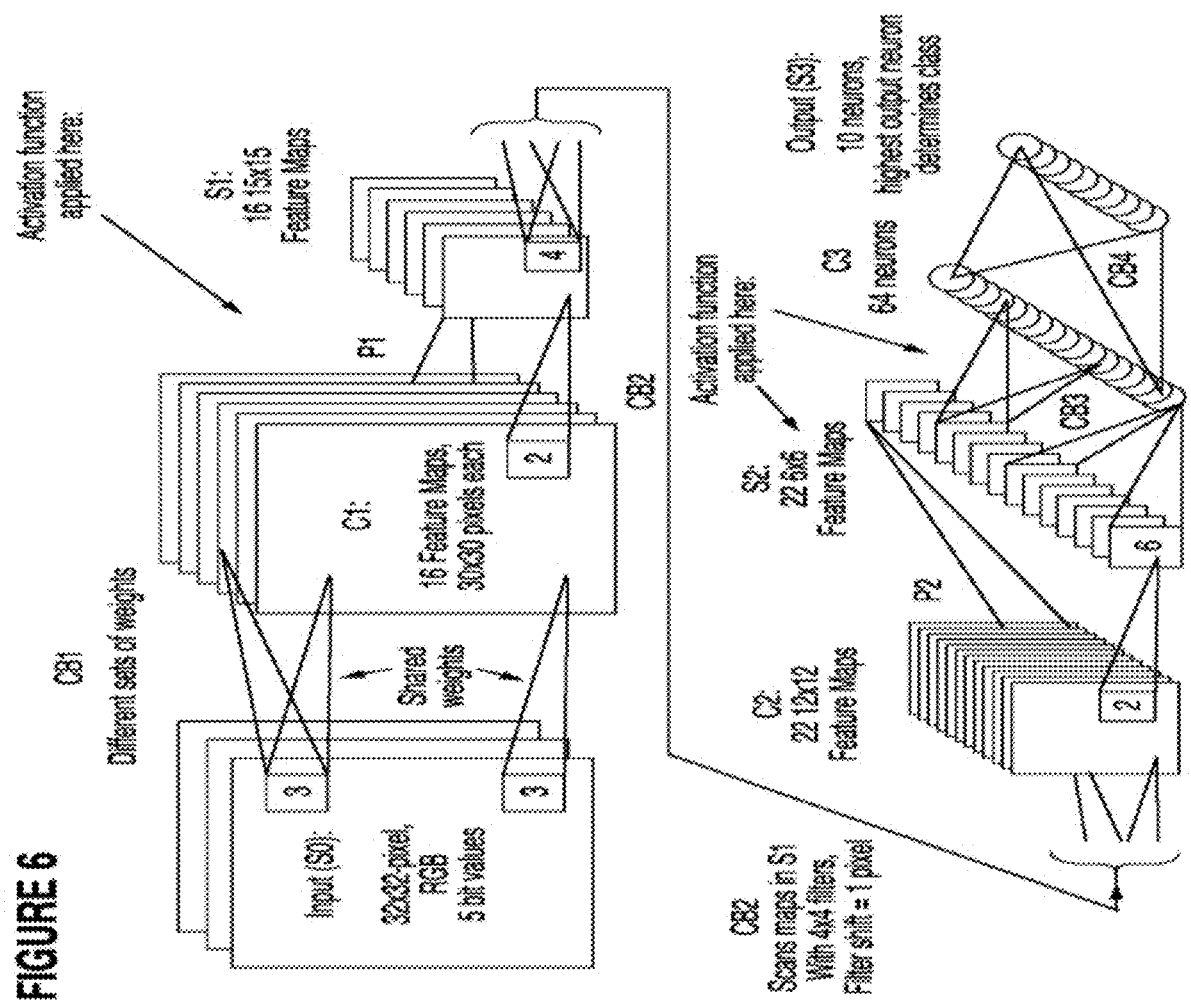
FIG. 6 is a diagram illustrating the different levels of an exemplary artificial neural network utilizing a non-volatile memory array.

FIG. 6 conceptually illustrates a non-limiting example of a neural network utilizing a non-volatile memory array. This example uses the non-volatile memory array neural net for a facial recognition application, but any other appropriate application could be implemented using a non-volatile memory array based neural network.

S0 is the input, which for this example is a 32×32 pixel RGB image with 5 bit precision (i.e. three 32×32 pixel arrays, one for each color R, G and B, each pixel being 5 bit precision). The synapses CB1 going from S0 to C1 have both different sets of weights and shared weights, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, whereby these 9 input values are multiplied by the appropriate weights and, after summing the outputs of that multiplication, a single output value is determined and provided by a first neuron of CB1 for generating a pixel of one of the layers of feature map C1. The 3×3 filter is then shifted one pixel to the right (i.e., adding the column of three pixels on the right, and dropping the column of three pixels on the left), whereby the 9 pixel values in this newly positioned filter are provided to the synapses CB1, whereby they are multiplied by the same weights and a second single output value is determined by the associated neuron. This process is continued until the 3×3 filter scans across the entire 32×32 pixel image, for all three colors and for all bits (precision values). The process is then repeated using different sets of weights to generate a different feature map of C1, until all the features maps of layer C1 have been calculated.

At C1, in the present example, there are 16 feature maps, with 30×30 pixels each. Each pixel is a new feature pixel extracted from multiplying the inputs and kernel, and therefore each feature map is a two dimensional array, and thus in this example the synapses CB1 constitutes 16 layers of two dimensional arrays (keeping in mind that the neuron layers and arrays referenced herein are logical relationships, not necessarily physical relationships—i.e., the arrays are not necessarily oriented in physical two dimensional arrays). Each of the 16 feature maps is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from C1 to S1, which pools values from consecutive, non-overlapping 2×2 regions in each feature map. The purpose of the pooling stage is to average out the nearby location (or a max function can also be used), to reduce the dependence of the edge location for example and to reduce the data size before going to the next stage. At S1, there are 16 15×15 feature maps (i.e., sixteen different arrays of 15×15 pixels each). The synapses and associated neurons in CB2 going from S1 to C2 scan maps in S1 with 4×4 filters, with a filter shift of 1 pixel. At C2, there are 22 12×12 feature maps. An activation function P2 (pooling) is applied before going from C2 to S2, which pools values from consecutive non-overlapping 2×2 regions in each feature map. At S2, there are 22 6×6 feature maps. An activation function is applied at the synapses CB3 going from S2 to C3, where every neuron in C3 connects to every map in S2. At C3, there are 64 neurons. The synapses CB4 going from C3 to the output S3 fully connects S3 to C3. The output at S3 includes 10 neurons, where the highest output neuron determines the class. This output could, for example, be indicative of an identification or classification of the contents of the original image.

Figure 7:
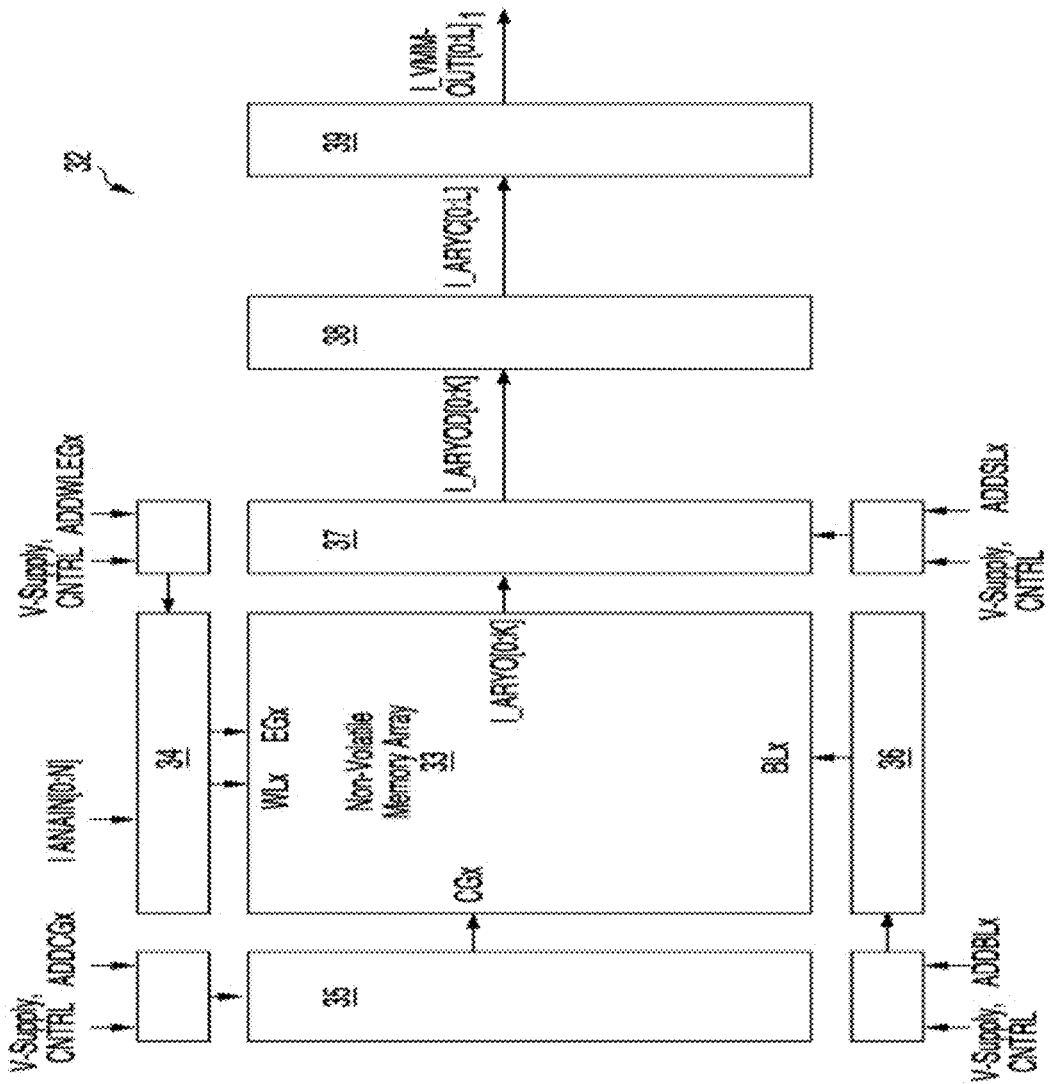
FIG. 7 is a block diagram illustrating a vector multiplier matrix.

Each level of synapses is implemented using an array, or a portion of an array, of non-volatile memory cells. FIG. 7 is a block diagram of the vector-by-matrix multiplication (VMM) array that includes the non-volatile memory cells, and is utilized as the synapses between an input layer and the next layer. Specifically, the VMM 32 includes an array of non-volatile memory cells 33, erase gate and word line gate decoder 34, control gate decoder 35, bit line decoder 36 and source line decoder 37, which decode the inputs for the memory array 33. Source line decoder 37 in this example also decodes the output of the memory cell array. Alternatively, bit line decoder 36 can decode the output of the memory array. The memory array serves two purposes. First, it stores the weights that will be used by the VMM. Second, the memory array effectively multiplies the inputs by the weights stored in the memory array and adds them up per output line (source line or bit line) to produce the output, which will be the input to the next layer or input to the final layer. By performing the multiplication and addition function, the memory array negates the need for separate multiplication and addition logic circuits and is also power efficient due to in-situ memory computation.

The output of the memory array is supplied to a differential summer (such as summing op-amp) 38, which sums up the outputs of the memory cell array to create a single value for that convolution. The differential summer is such as to realize summation of positive weight and negative weight with positive input. The summed up output values are then supplied to the activation function circuit 39, which rectifies the output. The activation function may include sigmoid, tanh, or ReLU functions. The rectified output values become an element of a feature map as the next layer (C1 in the description above for example), and are then applied to the next synapse to produce next feature map layer or final layer. Therefore, in this example, the memory array constitutes a plurality of synapses (which receive their inputs from the prior layer of neurons or from an input layer such as an image database), and summing op-amp 38 and activation function circuit 39 constitute a plurality of neurons.

Figure 8:
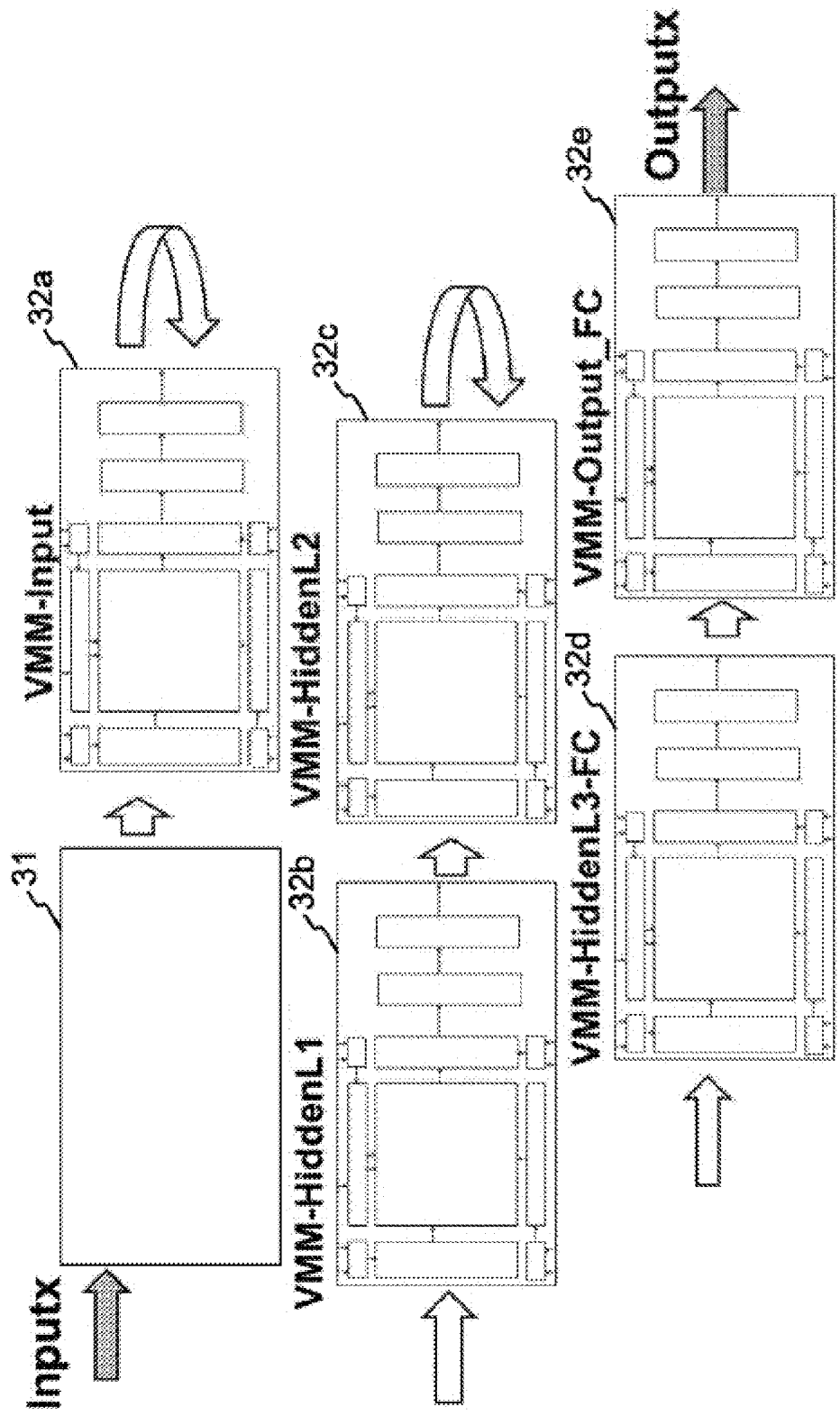
FIG. 8 is a block diagram illustrating various levels of a vector multiplier matrix.
Figure 14:
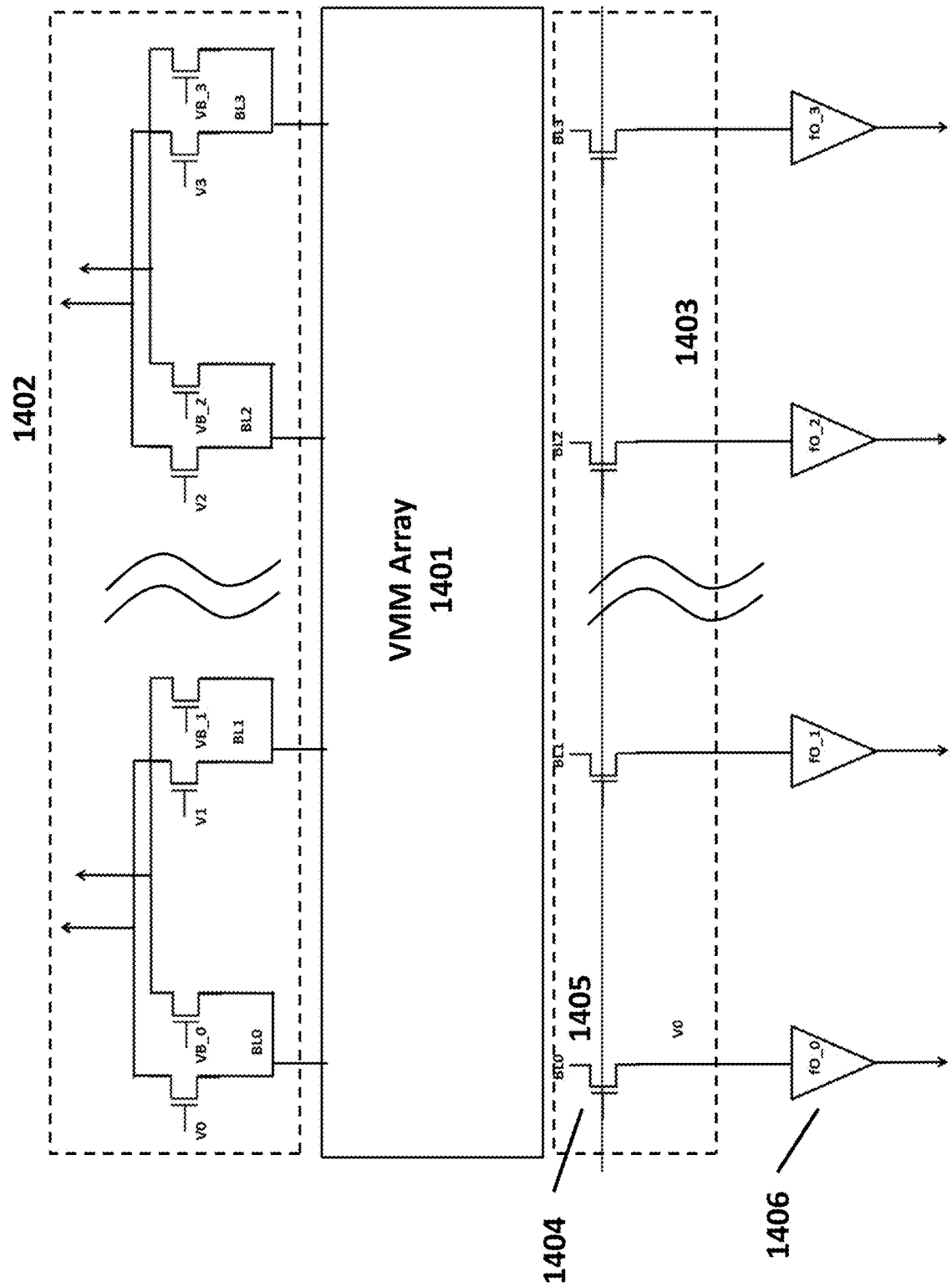
FIG. 14 depicts an embodiment of a bit line decoder for a vector multiplier matrix.

FIG. 8 is a block diagram of the various levels of VMM. As shown in FIG. 14, the input is converted from digital to analog by digital-to-analog converter 31, and provided to input VMM 32a. The output generated by the input VMM 32a is provided as an input to the next VMM (hidden level 1) 32b, which in turn generates an output that is provided as an input to the next VMM (hidden level 2) 32b, and so on. The various layers of VMM's 32 function as different layers of synapses and neurons of a convolutional neural network (CNN). Each VMM can be a stand-alone non-volatile memory array, or multiple VMMs could utilize different portions of the same non-volatile memory array, or multiple VMMs could utilize overlapping portions of the same non-volatile memory array. The example shown in FIG. 8 contains five layers (32a,32b,32c,32d,32e): one input layer (32a), two hidden layers (32b,32c), and two fully connected layers (32d,32e). One of ordinary skill in the art will appreciate that this is merely exemplary and that a system instead could comprise more than two hidden layers and more than two fully connected layers.

Vector-by-Matrix Multiplication (VMM) Arrays

Figure 9:
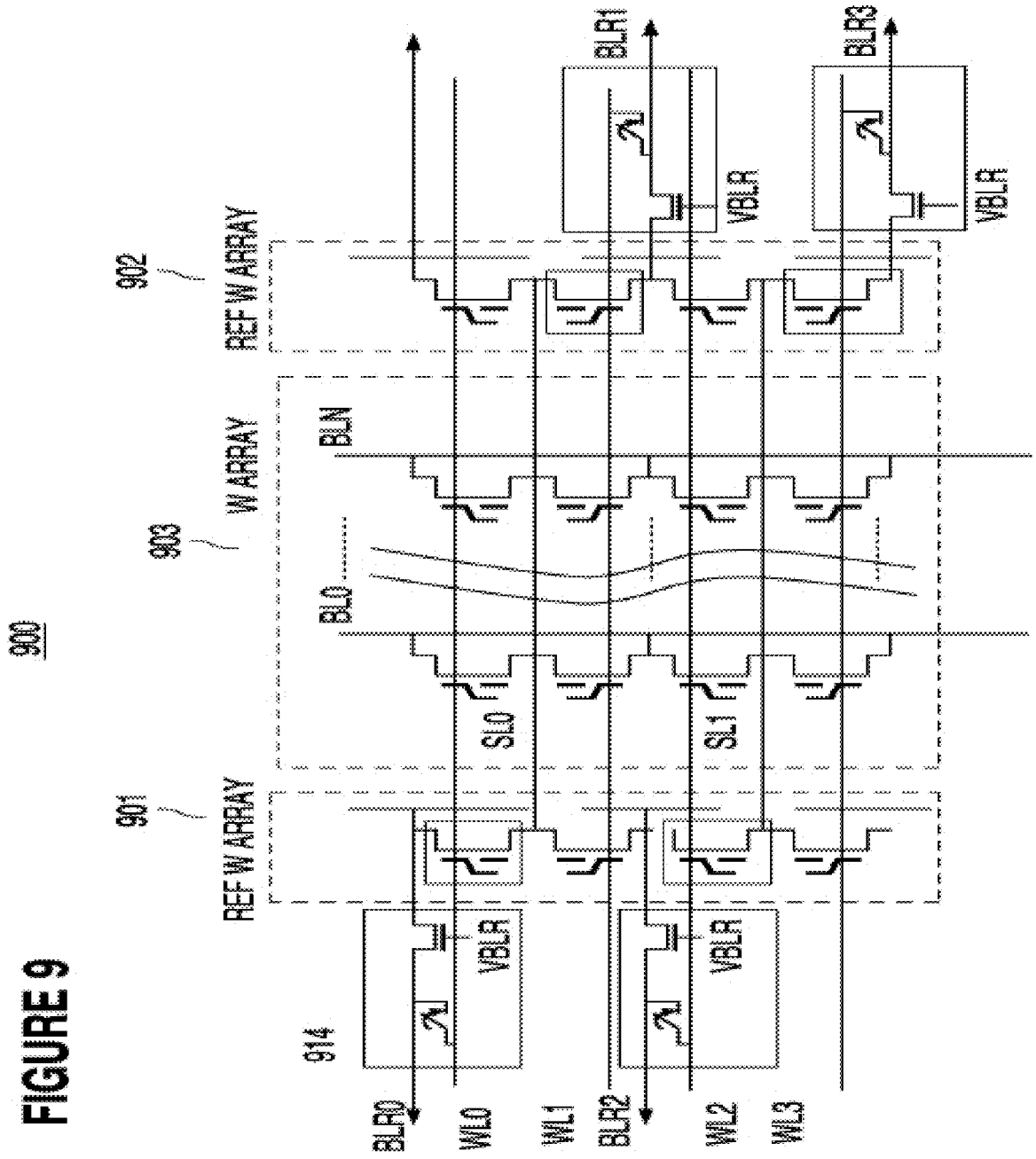
FIG. 9 depicts an embodiment of a vector multiplier matrix.

FIG. 9 depicts neuron VMM 900, which is particularly suited for memory cells of the type shown in FIG. 2, and is utilized as the synapses and parts of neurons between an input layer and the next layer. VMM 900 comprises a memory array 903 of non-volatile memory cells, reference array 901, and reference array 902. Reference arrays 901 and 902 serve to convert current inputs flowing into terminals BLR0-3 into voltage inputs WL0-3. Reference arrays 901 and 902 as shown are in the column direction. In general, the reference array direction is orthogonal to the input lines. In effect, the reference memory cells are diode connected through multiplexors (multiplexor 914, which includes a multiplexor and a cascoding transistor VBLR for biasing the reference bit line) with current inputs flowing into them. The reference cells are tuned to target reference levels.

Memory array 903 serves two purposes. First, it stores the weights that will be used by the VMM 900. Second, memory array 903 effectively multiplies the inputs (current inputs provided in terminals BLR0-3; reference arrays 901 and 902 convert these current inputs into the input voltages to supply to wordlines WL0-3) by the weights stored in the memory array to produce the output, which will be the input to the next layer or input to the final layer. By performing the multiplication function, the memory array negates the need for separate multiplication logic circuits and is also power efficient. Here, the voltage inputs are provided on the word lines, and the output emerges on the bit line during a read (inference) operation. The current placed on the bit line performs a summing function of all the currents from the memory cells connected to the bitline.

FIG. 42 depicts operating voltages for VMM 900. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

Figure 10:
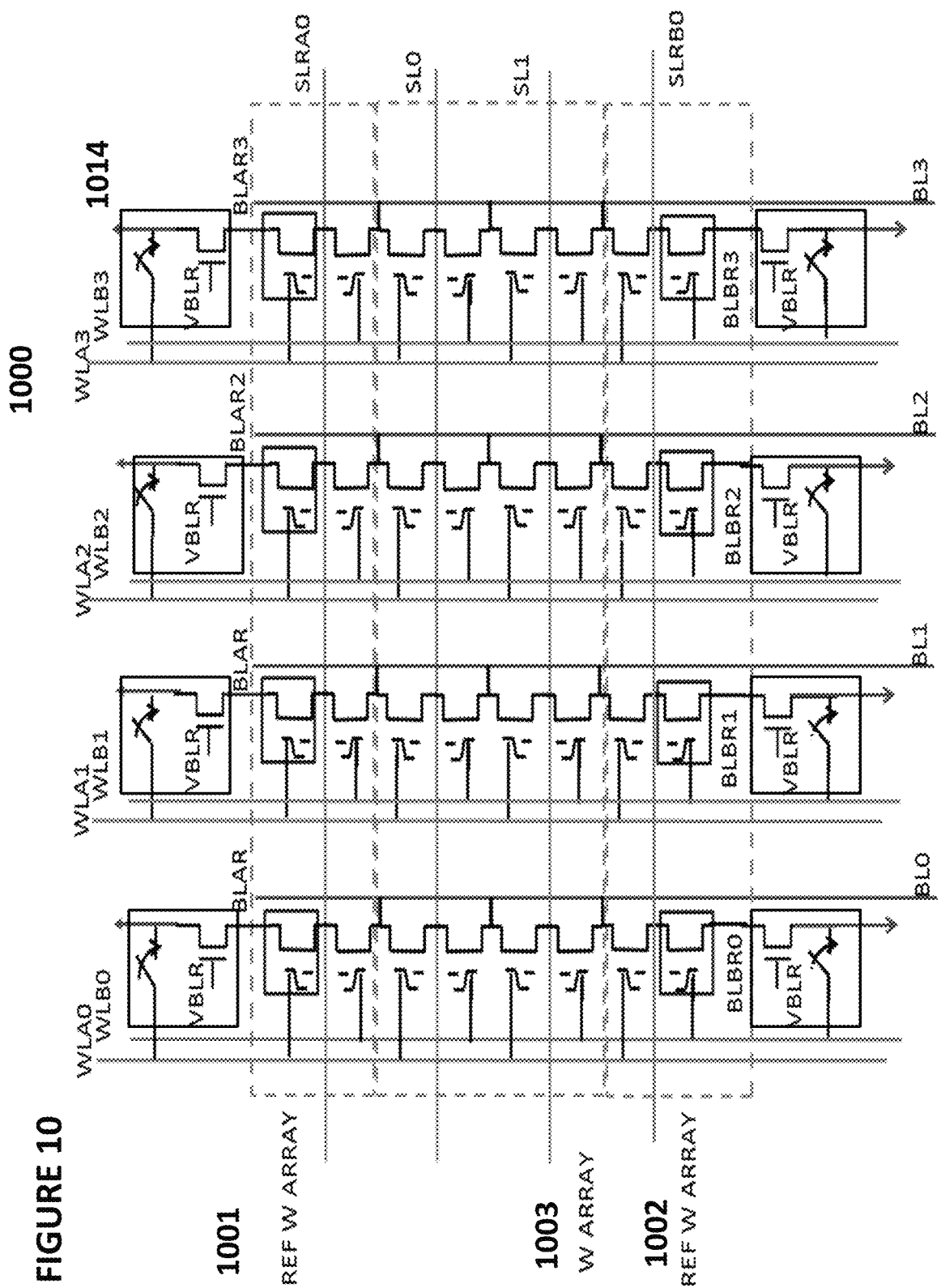
FIG. 10 depicts another embodiment of a vector multiplier matrix.

FIG. 10 depicts neuron VMM 1000, which is particularly suited for memory cells of the type shown in FIG. 2, and is utilized as the synapses and parts of neurons between an input layer and the next layer. VMM 1000 comprises a memory array 1003 of non-volatile memory cells, reference array 1001, and reference array 1002. VMM 1000 is similar to VMM 900 except that in VMM 1000 the word lines run in the vertical direction. There are two reference arrays 1001 (at the top, which provides a reference converting input current into voltage for the even rows) and 1002 (at the bottom, which provides a reference converting input current into voltage for the odd rows). Here, the inputs are provided on the word lines, and the output emerges on the source line during a read operation. The current placed on the source line performs a summing function of all the currents from the memory cells connected to the source line.

FIG. 43 depicts operating voltages for VMM 1000. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

Figure 11:
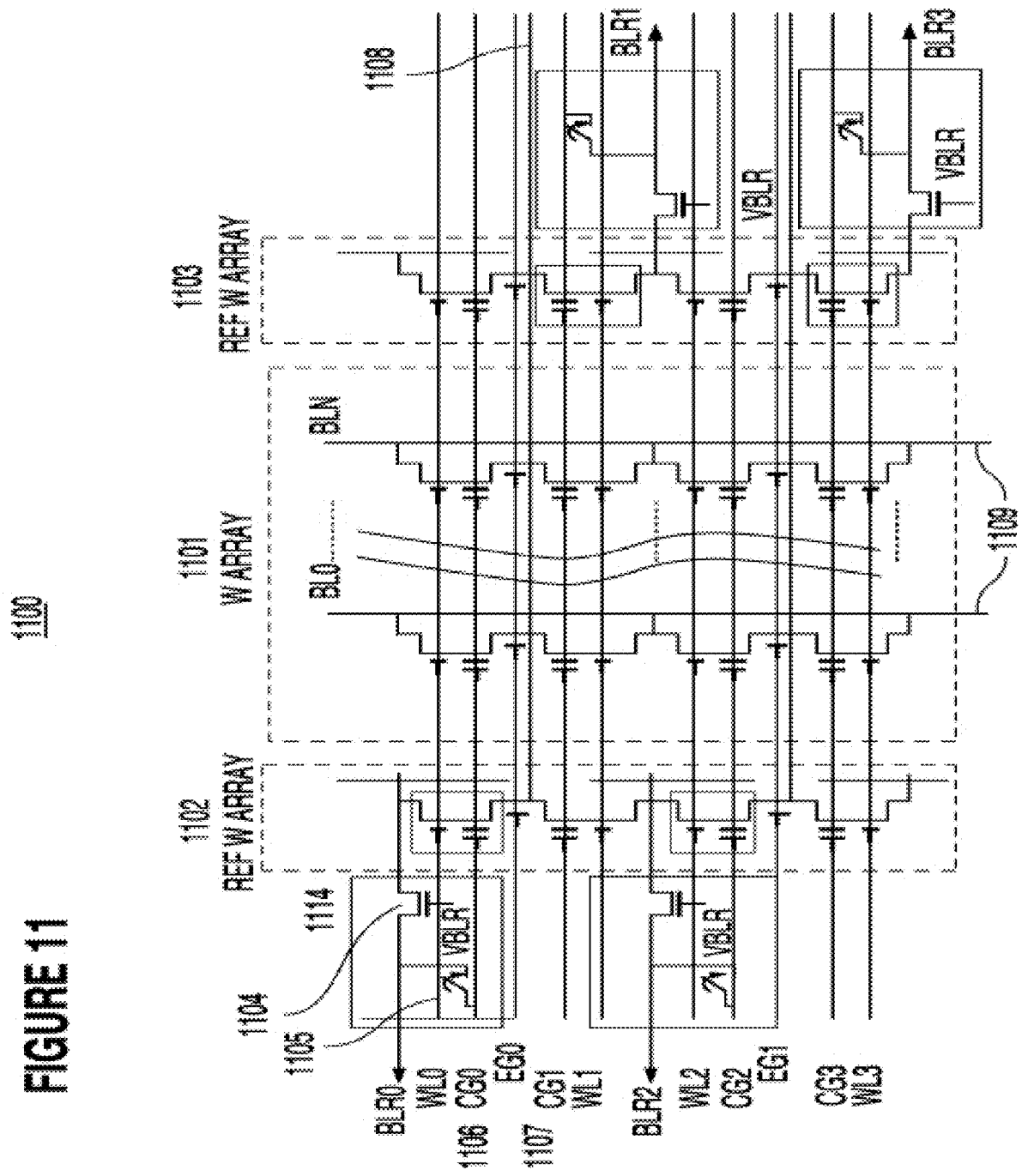
FIG. 11 depicts another embodiment of a vector multiplier matrix.

FIG. 11 depicts neuron VMM 1100, which is particularly suited for memory cells of the type shown in FIG. 3, and is utilized as the synapses and parts of neurons between an input layer and the next layer. VMM 1100 comprises a memory array 1101 of non-volatile memory cells, reference array 1102 (providing reference converting input current into input voltage for even rows), and reference array 1103 (providing reference converting input current into input voltage for odd rows). VMM 1100 is similar to VMM 900 except VMM 1100 further comprises control line 1106 couples to the control gates of a row of memory cells and control line 1107 coupled to the erase gates of adjoining rows of memory cells. Here, the wordlines, control gate lines, and erase gate lines are of the same direction. VMM further comprises reference bit line select transistor 1104 (part of mux 1114) that selectively couples a reference bit line to the bit line contact of a selected reference memory cell and switch 1105 (part of mux 1114) that selectively couples a reference bit line to control line 1106 for a particular selected reference memory cell. Here, the inputs are provided on the word lines (of memory array 1101), and the output emerges on the bit line, such as bit line 1109, during a read operation. The current placed on the bit line performs a summing function of all the currents from the memory cells connected to the bit line.

FIG. 44 depicts operating voltages for VMM 1100. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

Figure 12:
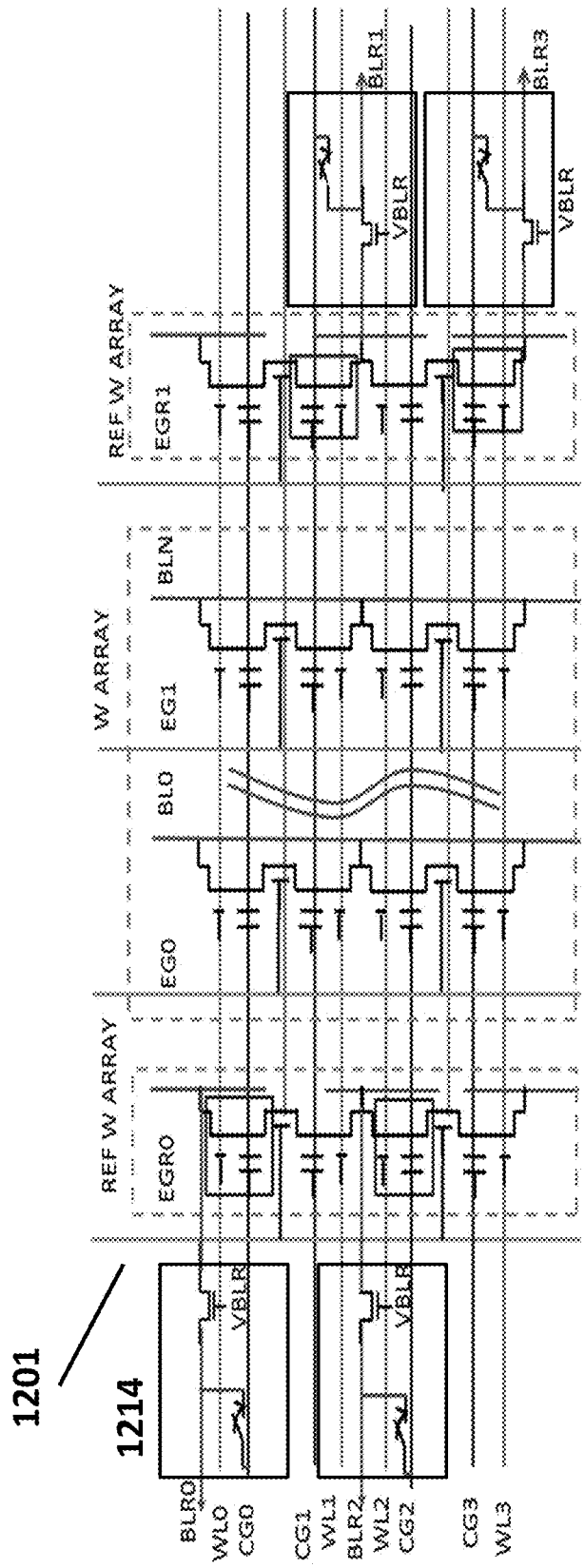
FIG. 12 depicts another embodiment of a vector multiplier matrix.

FIG. 12 depicts neuron VMM 1200, which is particularly suited for memory cells of the type shown in FIG. 3, and is utilized as the synapses and parts of neurons between an input layer and the next layer. VMM 1200 is similar to VMM 1100, except in VMM 1200, erase gate lines such as erase gate line 1201 run in a vertical direction. Here, the inputs are provided on the word lines, and the output emerges on the source lines. The current placed on the bit line performs a summing function of all the currents from the memory cells connected to the bit line.

FIG. 45 depicts operating voltages for VMM 1200. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

Figure 13:
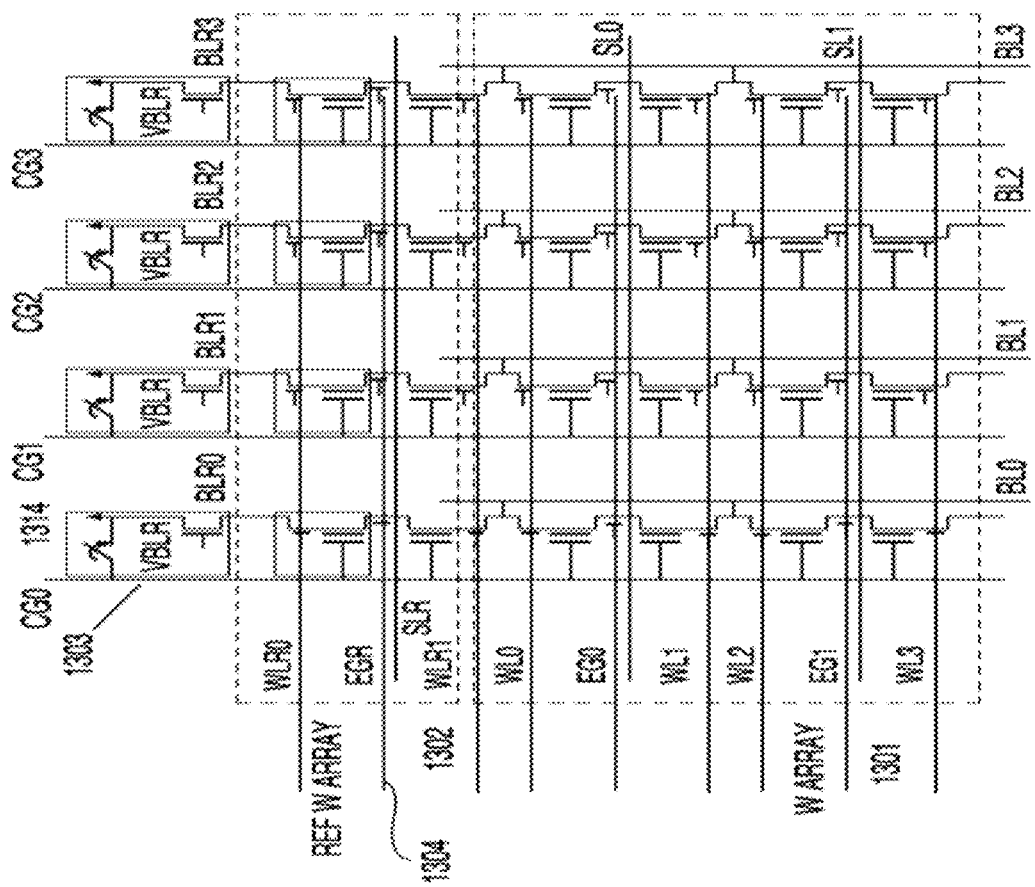
FIG. 13 depicts another embodiment of a vector multiplier matrix.

FIG. 13 depicts neuron VMM 1300, which is particularly suited for memory cells of the type shown in FIG. 3, and is utilized as the synapses and parts of neurons between an input layer and the next layer. VMM 1300 comprises a memory array 1301 of non-volatile memory cells and reference array 1302 (at the top of the array). Alternatively, another reference array can be placed at the bottom, similar to that of FIG. 10. In other respects, VMM 1300 is similar to VMM 1200, except in VMM 1300, control gates line such as control gate line 1303 run in a vertical direction (hence reference array 1302 in the row direction, orthogonal to the input control gate lines), and erase gate lines such as erase gate line 1304 run in a horizontal direction. Here, the inputs are provided on the control gate lines, and the output emerges on the source lines. In one embodiment only even rows are used, and in another embodiment, only odd rows are used. The current placed on the source line performs a summing function of all the currents from the memory cells connected to the source line.

As described herein for neural networks, the flash cells are preferably configured to operate in sub-threshold region.

The memory cells described herein are biased in weak inversion:

$$Ids = I_0 * e^{(Vg-Vth)/kVt} = w * I_0 * e^{(Vg)/kVt}$$

$$w = e^{(-Vth)/kVt}$$

For an I-to-V log converter using a memory cell to convert input current into an input voltage:

$$Vg = k * Vt * \log[Ids/wp * I_0]$$

For a memory array used as a vector matrix multiplier VMM, the output current is:

$$Iout = wa * I_0 * e^{(Vg)/kVt}, \text{ namely}$$

$$Iout = (wa/wp) * Iin = W * Iin$$

$$W = e^{(Vthp - Vtha)/kVt}$$

A wordline or control gate can be used as the input for the memory cell for the input voltage.

Alternatively, the flash memory cells can be configured to operate in the linear region:

$$Ids = \text{beta} * (Vgs - Vth) * Vds; \text{beta} = u * Cox * W/L$$

$$W\alpha(Vgs - Vth)$$

For an I-to-V linear converter, a memory cell operating in the linear region can be used to convert linearly an input/output current into an input/output voltage.

Other embodiments for the ESF vector matrix multiplier are as described in U.S. patent application Ser. No. 15/826,345, which is incorporated by reference herein. A sourceline or a bitline can be used as the neuron output (current summation output).

FIG. 14 depicts an embodiment of bit line decoder circuit 1400. Bit line decoder circuit 1400 comprises column decoder 1402 and analog neuromorphic neuron ("ANN") column decoder 1403, each of which is coupled to VMM array 1401. VMM array can be based on any of the VMM design discussed previously (such as VMM 900, 1000, 1100, 1200, and 1300) or other VMM designs.

One challenge with analog neuromorphic systems is that the system must be able to program and verify (which involves a read operation) individual selected cells, and it also must be able to perform an ANN read where all of the cells in the array are selected and read. In other words, a bit line decoder must sometimes select only one bit line and in other instances must select all bit lines.

Bit line decoder circuit 1400 accomplishes this purpose. Column decoder 1402 is a conventional column decoder (program and erase, or PE, decoding path) and can be used to select an individual bit line such as for program and program verify (a sensing operation). Outputs of the column decoder 1402 are coupled to program/erase (PE) column driver circuit for controlling program, PE verify, and erase (not shown in FIG. 14). ANN column decoder 1403 is a column decoder that is specifically designed to enable a read operation on every bit line at the same time. ANN column decoder 1403 comprises exemplary select transistor 1405 and output circuit (e.g., current summer and activation function such as tanh, sigmoid, ReLU) 1406 coupled to a bit line (here, BL0). A set of the same devices is attached to each of the other bit lines. All of the select transistors, such as select transistor 1405, is coupled to select line 1404. During an ANN read operation, select line 1404 is enabled, which turns on each of the select transistors such as select transistor 1405, which then causes current from each bit line to be received by an output circuit such as circuit 1406 and output.

Figure 15:
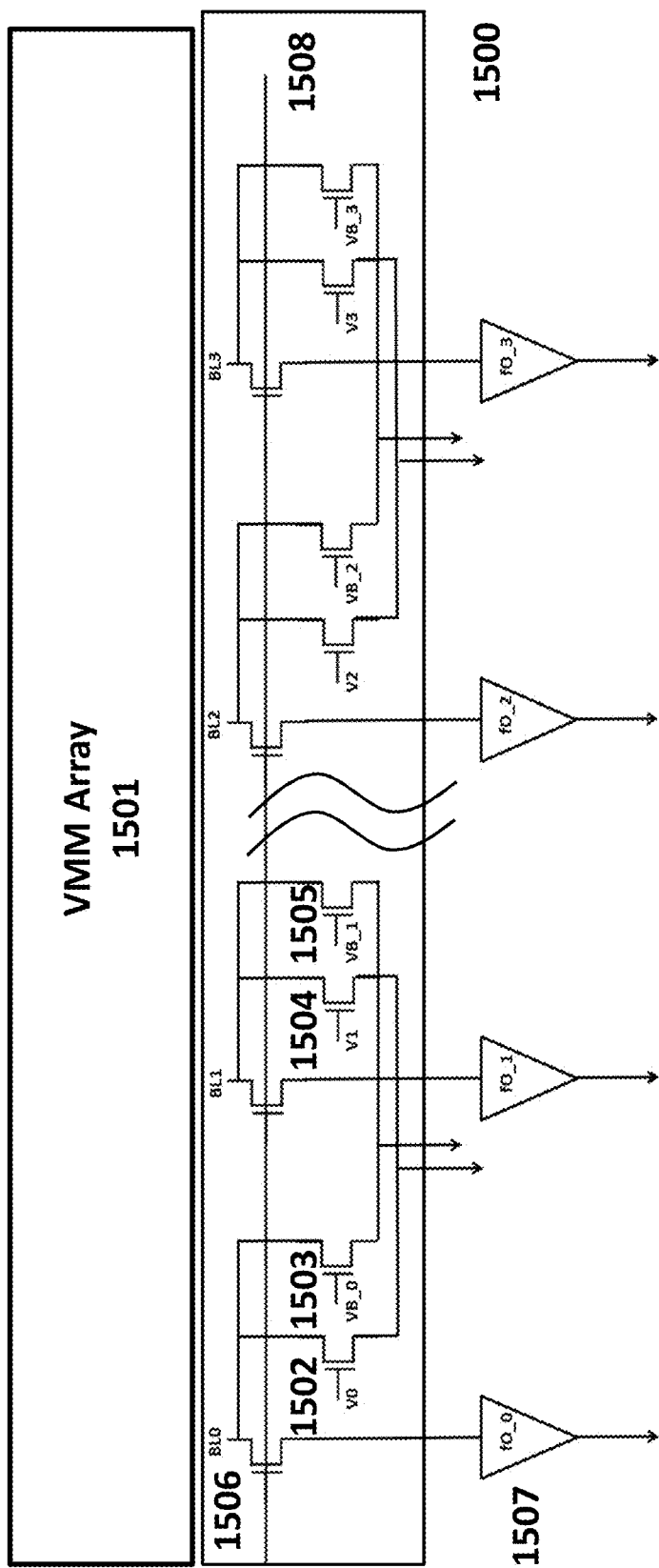
FIG. 15 depicts another embodiment of a bit line decoder for a vector multiplier matrix.

FIG. 15 depicts an embodiment of bit line decoder circuit 1500. Bit line decoder circuit 1500 is coupled to VMM array 1501. VMM array can be based on any of the VMM design discussed previously (such as VMM 900, 1000, 1100, 1200, and 1300) or other VMM designs.

Select transistors 1502 and 1503 are controlled by a pair of complementary control signals (V0 and VB_0) and are coupled to a bit line (BL0). Select transistors 1504 and 1505 are controlled by another pair of complementary control signals (V1 and VB_1) and are coupled to another bit line (BL1). Select transistors 1502 and 1504 are coupled to the same output such as for enabling programming and select transistors 1503 and 1505 are coupled to the same output such as for inhibit programming. The output lines of the transistors 1502/1503/1504/1505 (program and erase PE decoding path) are such as coupled to a PE column driver circuit for controlling program, PE verify, and erase (not shown).

Select transistor 1506 is coupled to a bit line (BL0) and to output and activation function circuit 1507 (e.g., current summer and activation function such as tanh, sigmoid, ReLU). Select transistor 1506 is controlled by control line 1508.

When only BL0 is to be activated, control line 1508 is de-asserted and signal V0 is asserted, thus reading BL0 only. During an ANN read operation, control line 1508 is asserted, select transistor 1506 and similar transistors are turned on, and all bit lines are read such as for all neuron processing.

Figure 16:
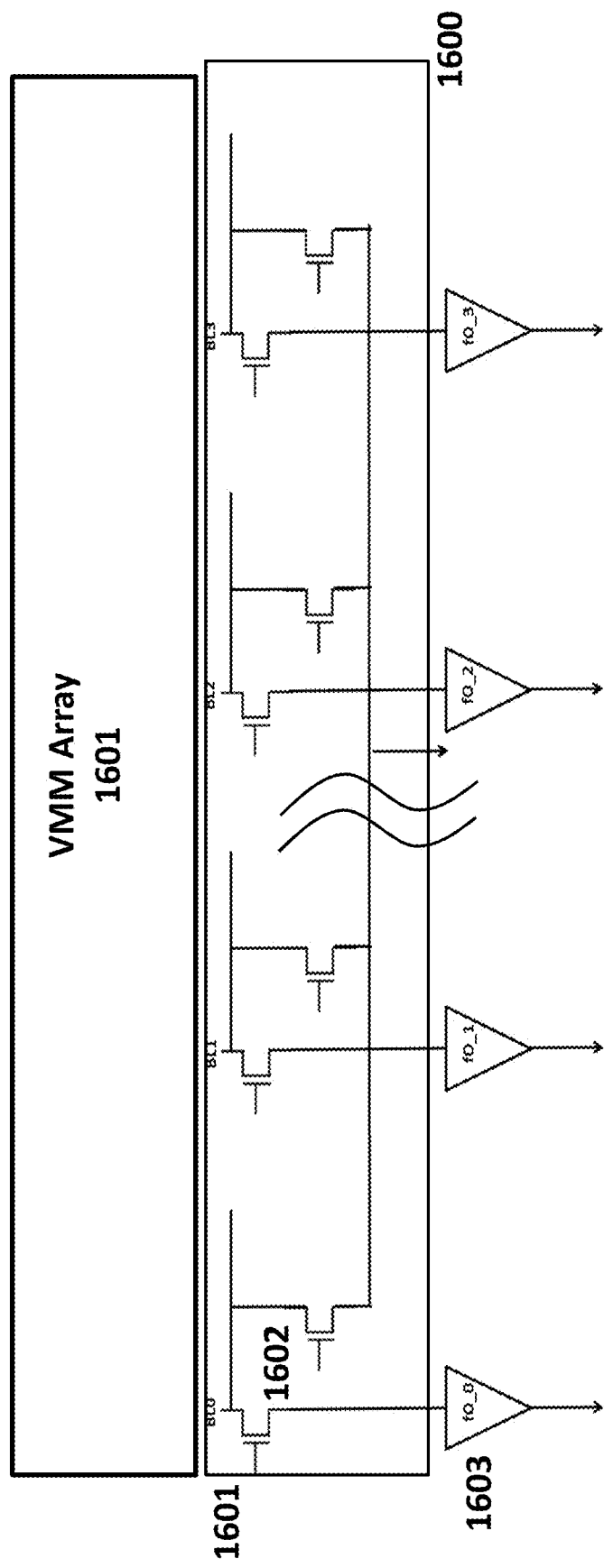
FIG. 16 depicts another embodiment of a bit line decoder for a vector multiplier matrix.

FIG. 16 depicts an embodiment of bit line decoder circuit 1600. Bit line decoder circuit 1600 is coupled to VMM array 1601. VMM array can be based on any of the VMM design discussed previously (such as VMM 900, 1000, 1100, 1200, and 1300) or other VMM designs.

Select transistor 1601 is coupled to a bit line (BL0) and to output and activation function circuit 1603. Select transistor 1602 is coupled to a bit line (BL0) and to a common output (PE decoding path).

When only BL0 is to be activated, select transistor 1602 is activated, and BL0 is attached to the common output. During an ANN read operation, select transistor 1601 and similar transistors are turned on, and all bit lines are read.

For the decoding in the FIGS. 14,15, and 16, for an un-selected transistor, a negative bias can be applied to reduce the transistor leakage from affecting the memory cell performance. Or a negative bias can be applied to the PE decoding path while the array is in the ANN operation. The negative bias can be from –0.1V to –0.5V or more.

Figure 17:
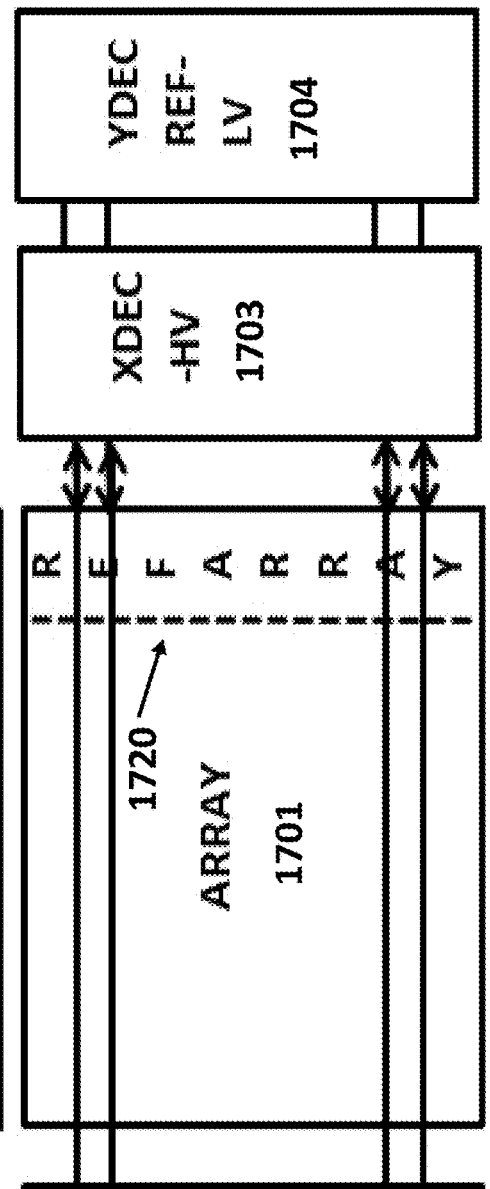
FIG. 17 depicts a system for operating a vector multiplier matrix.

FIG. 17 depicts VMM system 1700. VMM system 1700 comprises VMM array 1701 and reference array 1720 (which can be based on any of the VMM design discussed previously, such as VMM 900, 1000, 1100, 1200, and 1300, or other VMM designs), low voltage row decoder 1702, high voltage row decoder 1703, reference cell low voltage column decoder 1704 (shown for the reference array in the column direction, meaning providing input to output conversion in the row direction), bit line PE driver 1712, bit line multiplexor 1706, activation function circuit and summer 1707, control logic 1705, and analog bias circuit 1708.

As shown, the reference cell low voltage column decoder 1704 is for the reference array 1720 in the column direction, meaning providing input to output conversion in the row direction. If the reference array is in the row direction, the reference decoder needs to be done on top and/or bottom of the array, to providing input to output conversion in the column direction.

Low voltage row decoder 1702 provides a bias voltage for read and program operations and provides a decoding signal for high voltage row decoder 1703. High voltage row decoder 1703 provides a high voltage bias signal for program and erase operations. Reference cell low voltage column decoder 1704 provides a decoding function for the reference cells. Bit line PE driver 1712 provides controlling function for bit line in program, verify, and erase. Bias circuit 1705 is a shared bias block that provides the multiple voltages needed for the various program, erase, program verify, and read operations.

Figure 18:
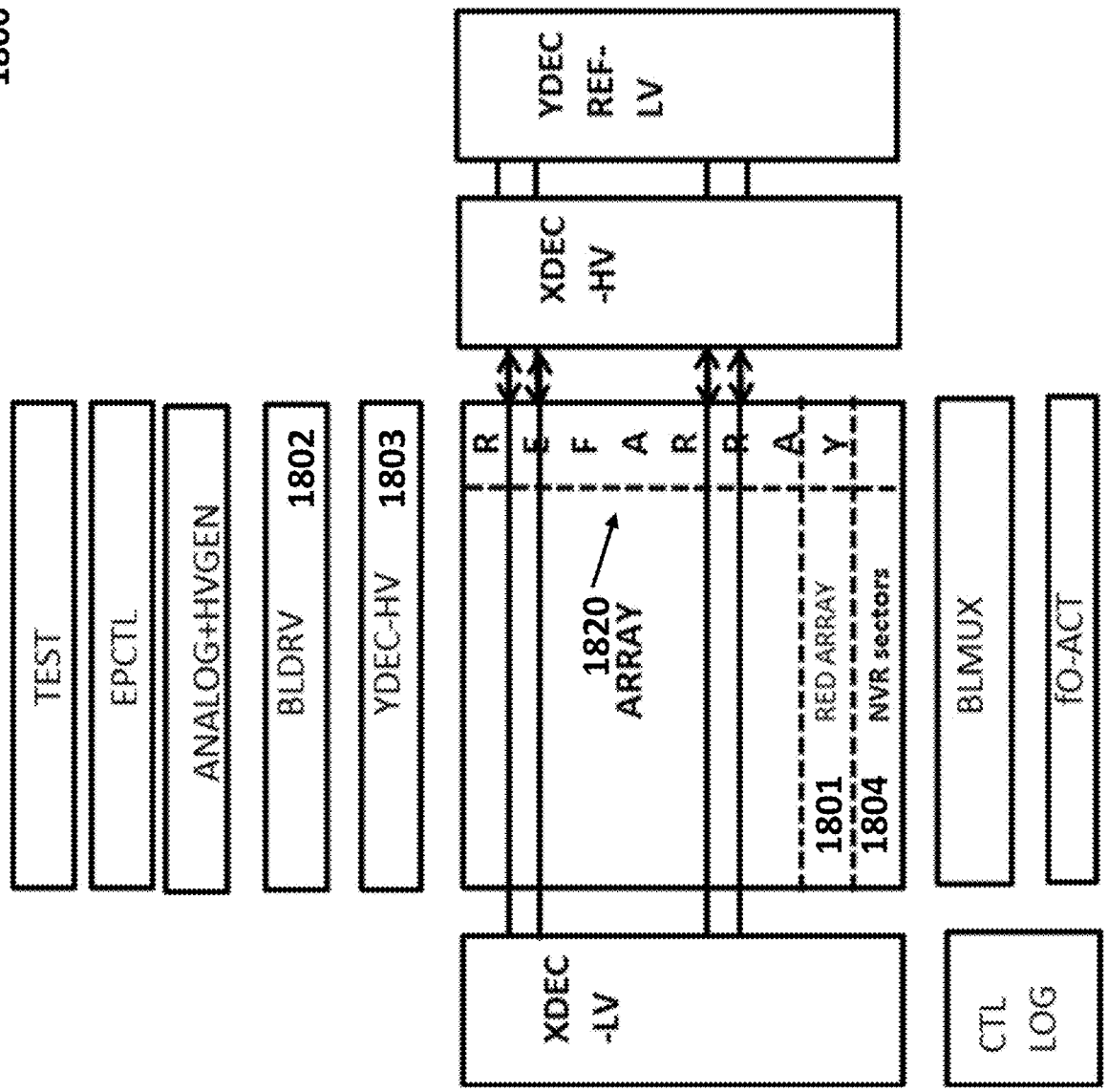
FIG. 18 depicts another system for operating a vector multiplier matrix.

FIG. 18 depicts VMM system 1800. VMM system 1800 is similar to VMM system 1700, except that VMM system 1800 further comprises red array 1801, bit line PE driver BLDRV 1802, high voltage column decoder 1803, NVR sectors 1804, and reference array 1820. High voltage column decoder 1803 provides a high voltage bias for vertical decoding lines. Red array 1802 provides array redundancy for replacing a defective array portion. NVR (non-volatile register aka info sector) sectors 1804 are sectors that are array sectors used to store user info, device ID, password, security key, trimbits, configuration bits, manufacturing info, etc.

Figure 19:
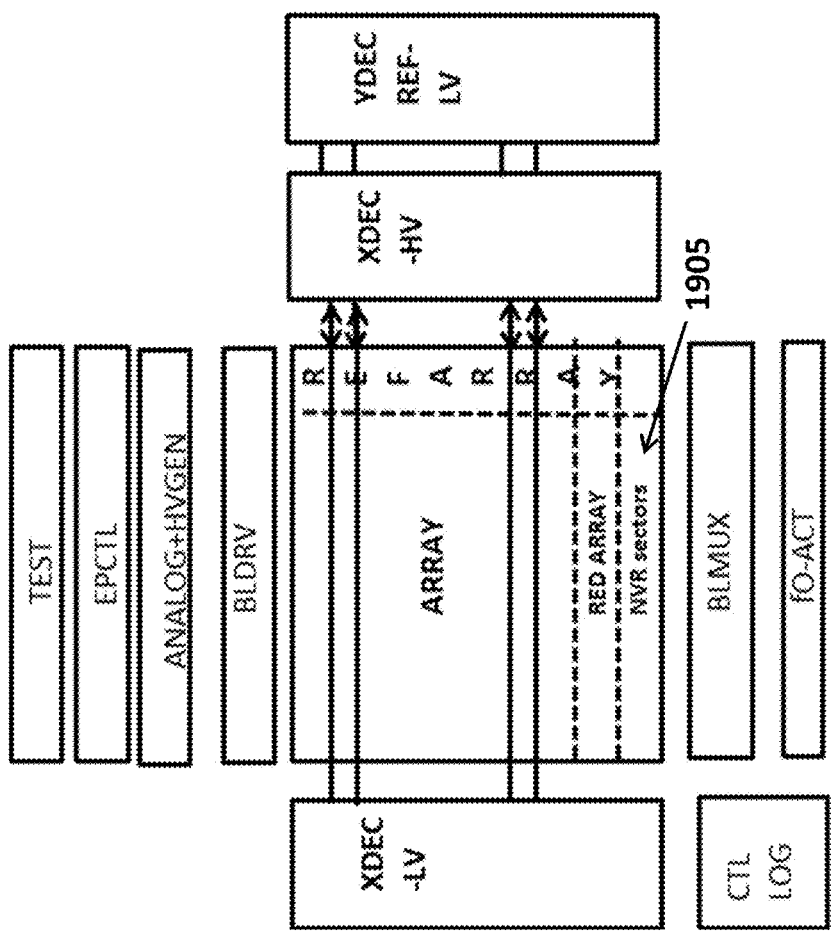
FIG. 19 depicts another system for operating a vector multiplier matrix.
Figure 19:
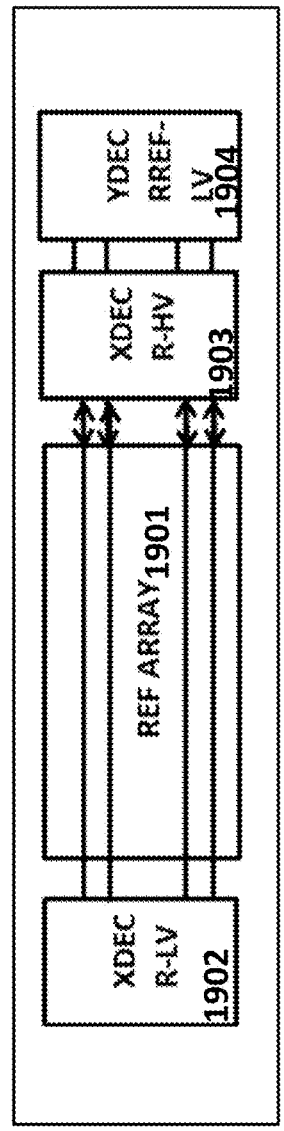

FIG. 19 depicts VMM system 1900. VMM system 1900 is similar to VMM system 1800, except that VMM system 1900 further comprises reference system 1999. Reference system 1999 comprises reference array 1901, reference array low voltage row decoder 1902, reference array high voltage row decoder 1903, and reference array low voltage column decoder 1904. The reference system can be shared across multiple VMM systems. VMM system further comprises NVR sectors 1905.

Reference array low voltage row decoder 1902 provides a bias voltage for read and programming operations involving reference array 1901 and also provides a decoding signal for reference array high voltage row decoder 1903. Reference array high voltage row decoder 1903 provides a high voltage bias for program and operations involving reference array 1901. Reference array low voltage column decoder 1904 provides a decoding function for reference array 1901. Reference array 1901 is such as to provide reference target for program verify or cell margining (searching for marginal cells).

Figure 20:
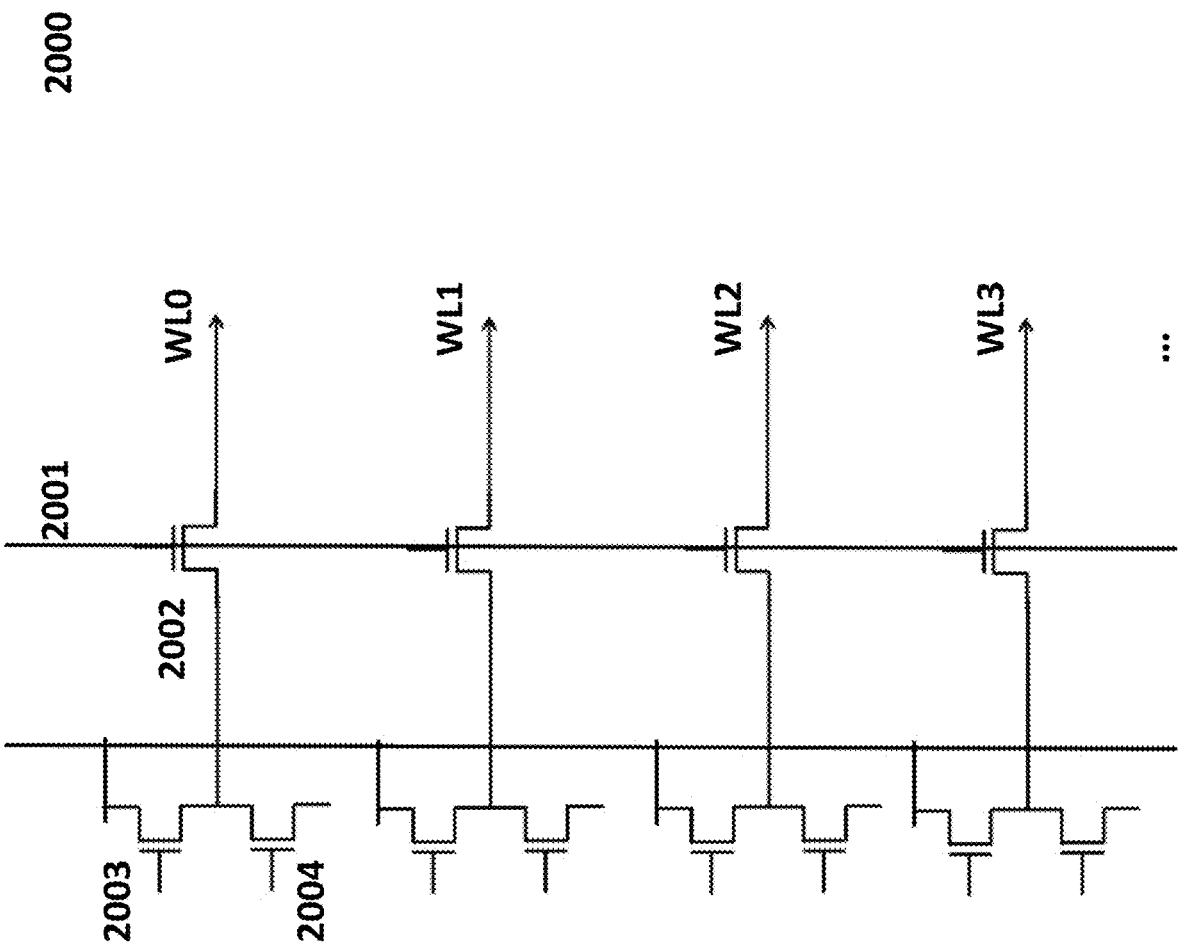
FIG. 20 depicts an embodiment of a word line driver for use with a vector multiplier matrix.

FIG. 20 depicts word line driver 2000. Word line driver 2000 selects a word line (such as exemplary word lines WL0, WL1, WL2, and WL3 shown here) and provides a bias voltage to that word line. Each word line is attached to a select transistor, such as select iso (isolation) transistor 2002, that is controlled by control line 2001. Iso transistor 2002 is used to isolate the high voltage such as from erase (e.g., 8-12V) from word line decoding transistors, which can be implemented with 10 transistors (e.g., 1.8V, 3.3V). Here, during any operation, control line 2001 is activated and all select transistors similar to select iso transistor 2002 are turned on. Exemplary bias transistor 2003 (part of wordline decoding circuit) selectively coupled a word line to a first bias voltage (such as 3V) and exemplary bias transistor 2004 (part of wordline decoding circuit) selectively coupled a word line to a second bias voltage (lower than the first bias voltage, including ground, a bias in between, a negative voltage bias to reduce leakage from un-used memory rows). During an ANN read operation, all used word lines will be selected and tied to the first bias voltage. All un-used wordlines are tied to the second bias voltage. During other operations such as for program operation, only one word line will be selected and the other word lines till be tied to the second bias voltage, which can be a negative bias (e.g., −0.3 to −0.5V or more) to reduce array leakage.

Figure 21:
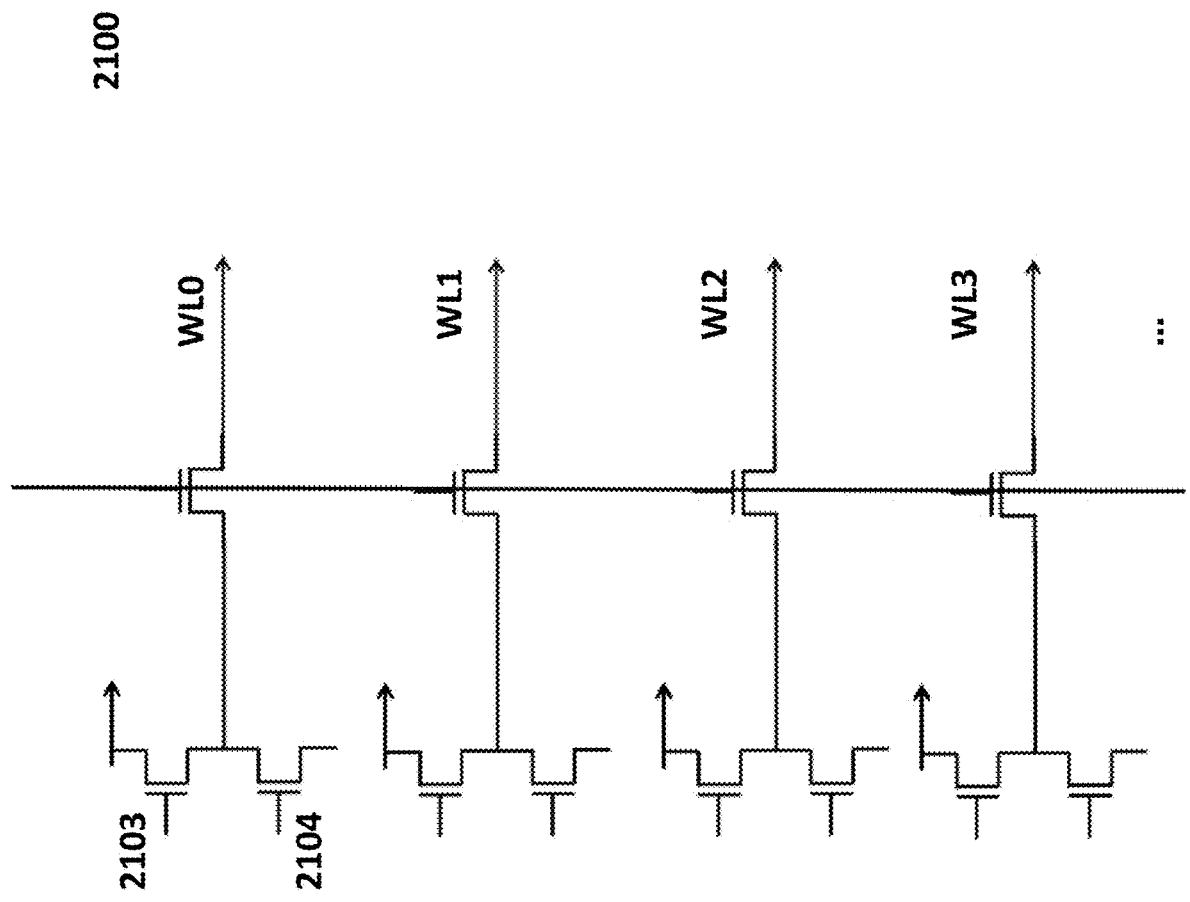
FIG. 21 depicts another embodiment of a word line driver for use with a vector multiplier matrix.

FIG. 21 depicts word line driver 2100. Word line driver 2100 is similar to word line driver 2000, except that the top transistor such as bias transistor 2103 can be individually coupled to a bias voltage, and all such transistors are not tied together as in word line driver 2000. This allows all wordline to have different independent voltages in parallel at the same times.

Figure 22:
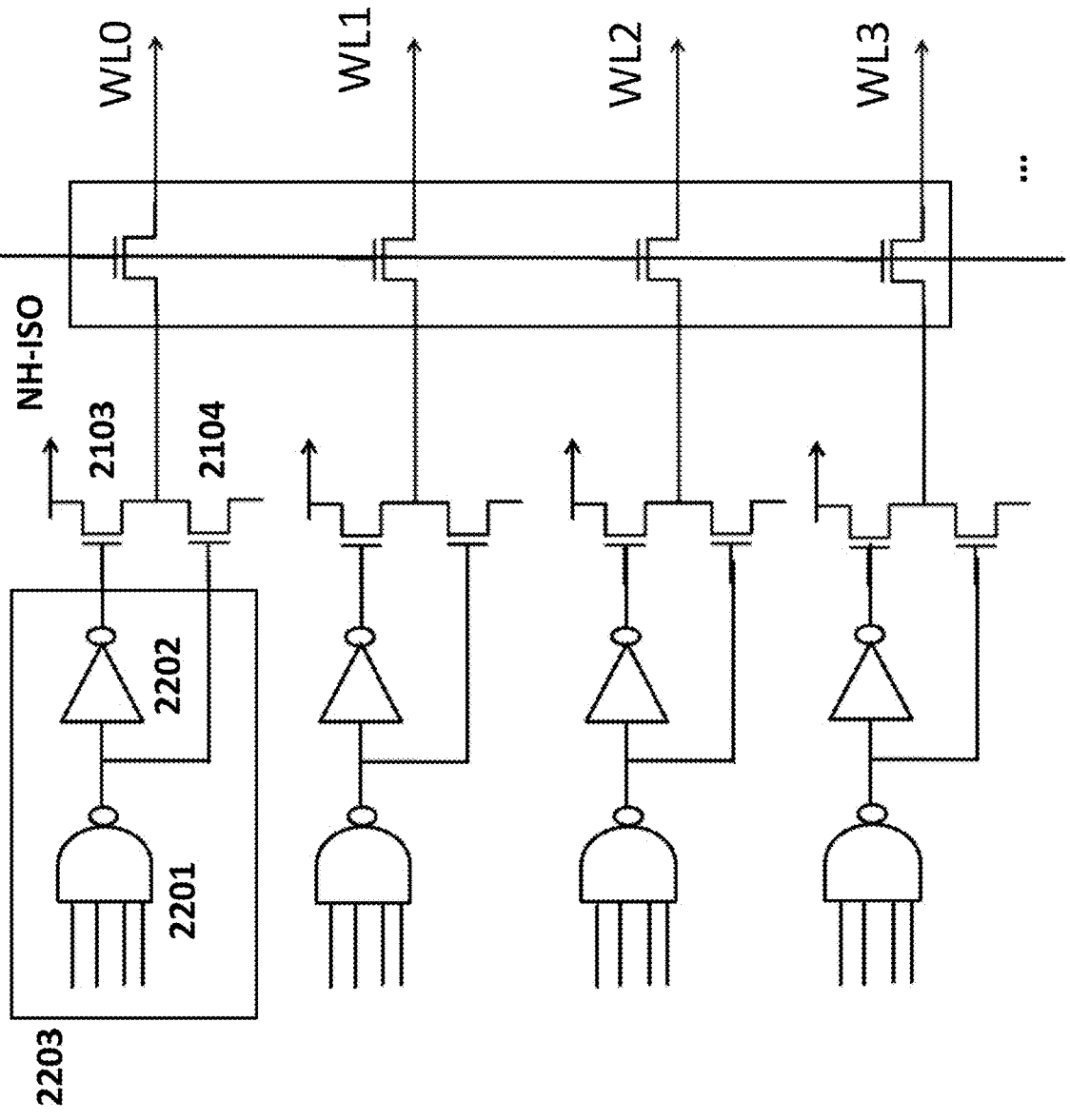
FIG. 22 depicts another embodiment of a word line driver for use with a vector multiplier matrix.

FIG. 22 depicts word line driver 2200. Word line driver 2200 is similar to word line driver 2100, except that bias transistors 2103 and 2104 are coupled to decoder circuit 2201 and inverter 2202. Thus, FIG. 22 depicts a decoding sub-circuit 2203 within word line driver 2200.

Figure 23:
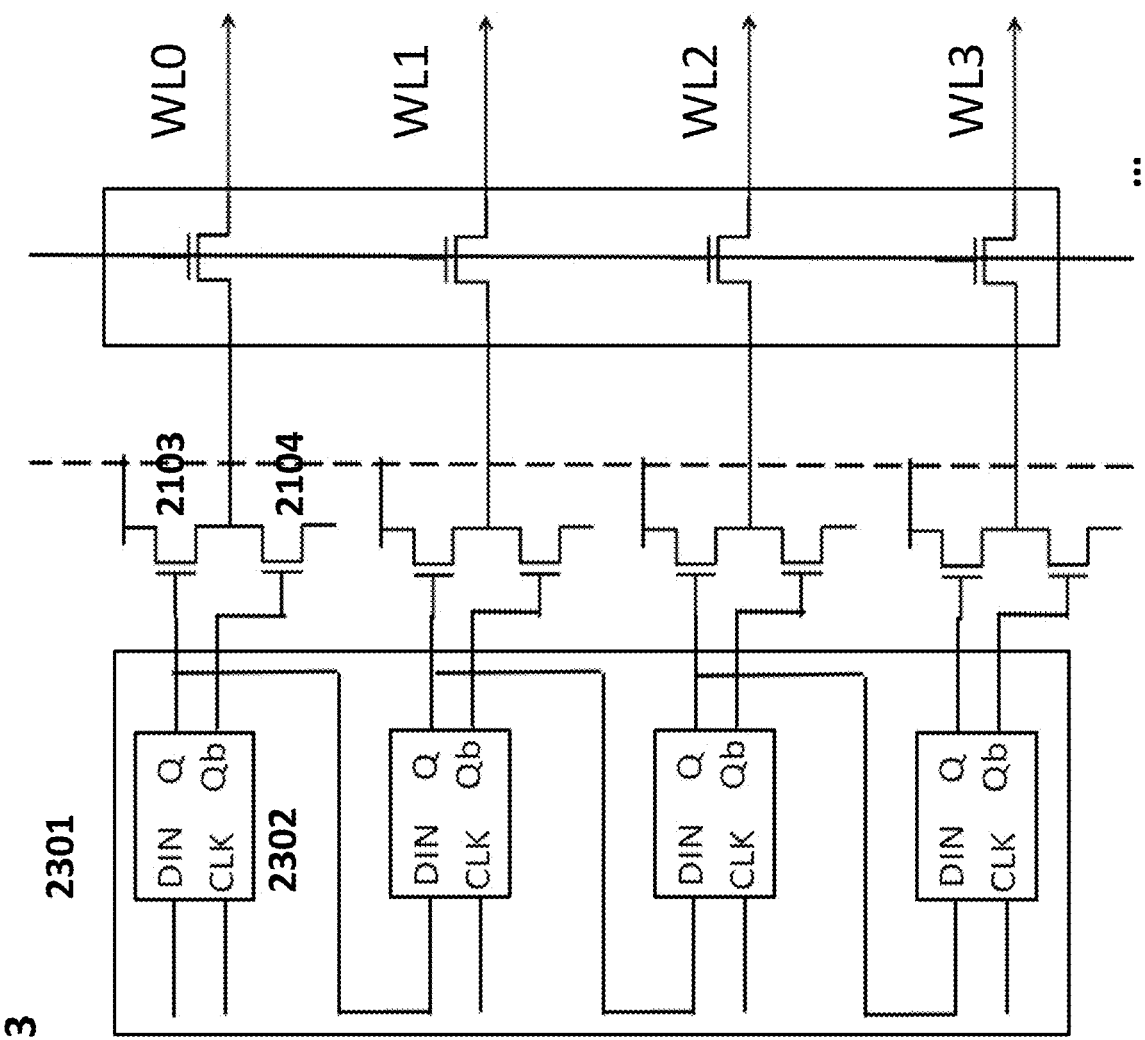
FIG. 23 depicts another embodiment of a word line driver for use with a vector multiplier matrix.

FIG. 23 depicts word line driver 2300. Word line driver 2300 is similar to word line driver 2100, except that bias transistors 2103 and 2104 are coupled to the outputs of stage 2302 of shift register 2301. The shift register 1301 allows by serial shifting in data (serially clocking the registers) to control each row independently, such as enabling one or more rows to be enabled at the same times depending on the shifted in data pattern.

Figure 24:
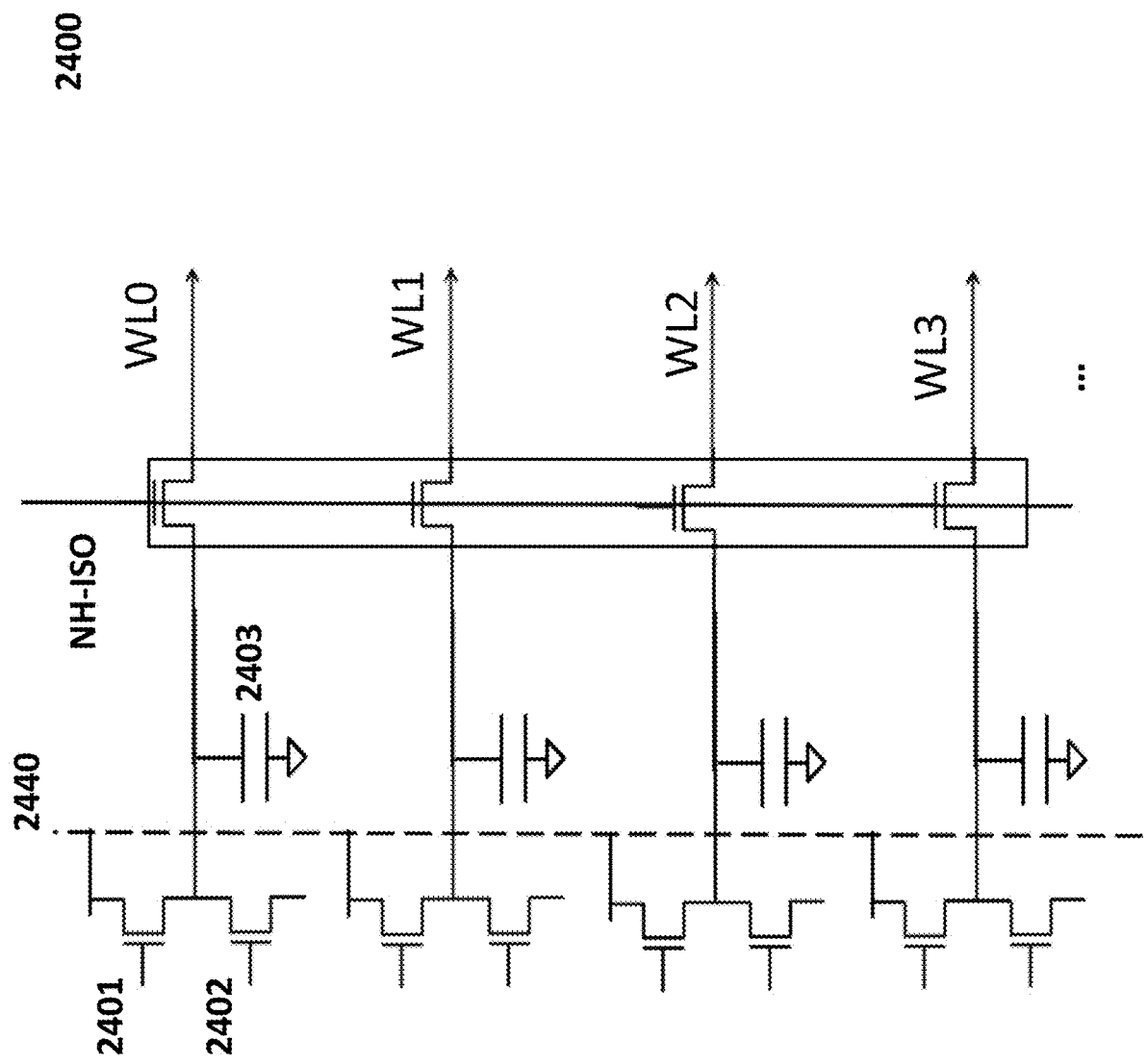
FIG. 24 depicts another embodiment of a word line driver for use with a vector multiplier matrix.

FIG. 24 depicts word line driver 2400. Word line driver 2400 is similar to word line driver 2000, except that each select transistor is further coupled to a capacitor, such as capacitor 2403. Capacitor 2403 can provide a pre-charge or bias to the word line at the beginning of an operation, enabled by transistor 2401 to sample voltage on line 2440. Capacitor 2403 acts to sample and hold (S/H) the input voltage for each wordline. Transistors 2401 are off during the ANN operation (array current summer and activation function) of the WM array, meaning that the voltage on the S/H capacitor will serve as a (floating) voltage source for the wordline. Alternatively, capacitor 2403 can be provided by the word line capacitance from the memory array.

Figure 25:
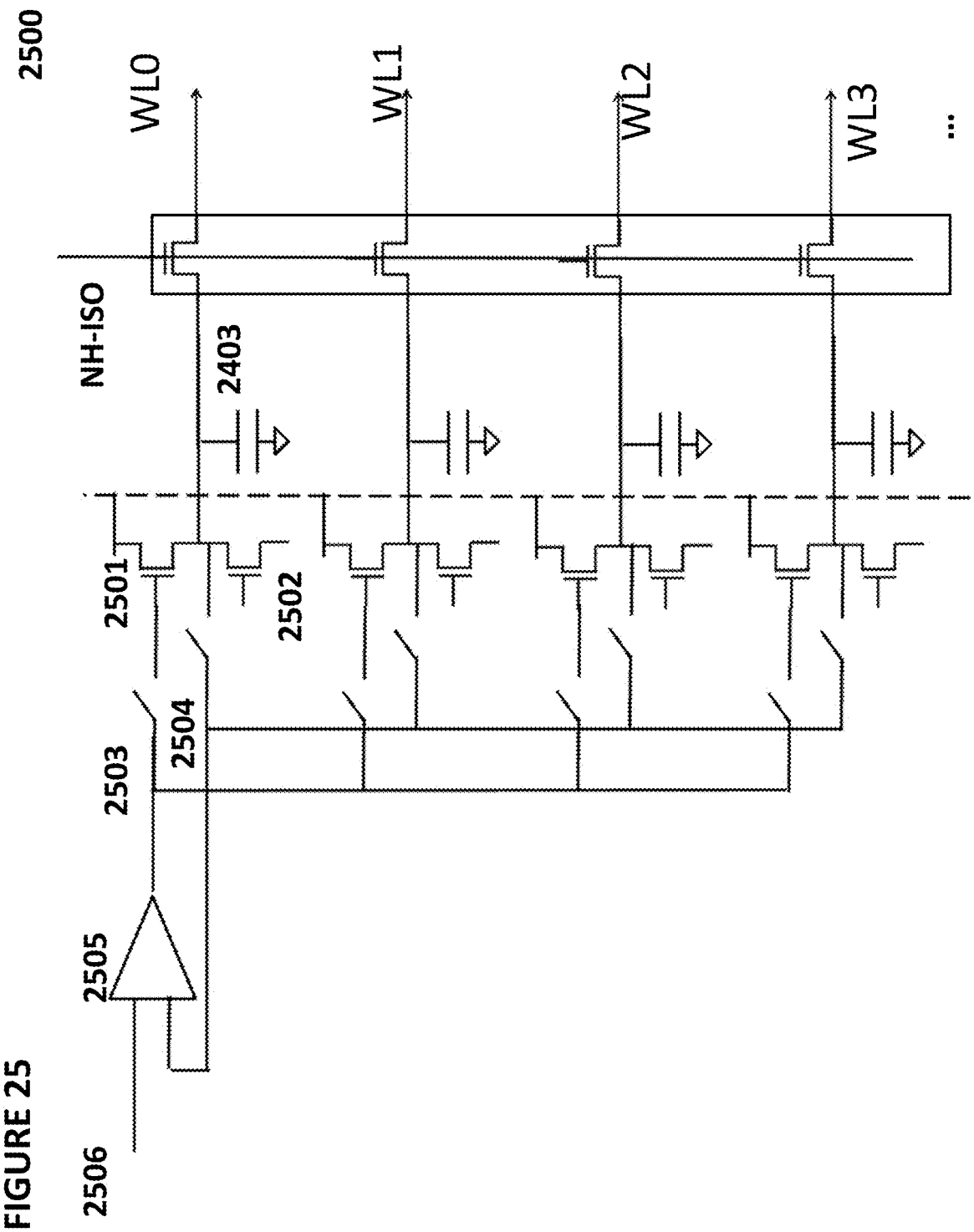
FIG. 25 depicts another embodiment of a word line driver for use with a vector multiplier matrix.

FIG. 25 depicts word line driver 2500. Word line driver 2500 is similar to previously-described word line drivers, except that bias transistors 2501 and 2502 are connected to switches 2503 and 2504, respectively. Switch 2503 receives the output of opa (operational amplifier) 2505, and switch 2504 provides a reference input to negative input of the opa 2505, which essentially provides the voltage stored by capacitor 2403 by action of closed loop provided by the opa 2505, the transistor 2501, the switches 2503 and 2504. In this manner, when switches 2503 and 2504 are closed, the voltage on the input 2506 is superimposed on the capacitor 2403 by the transistor 2501. Alternatively, capacitor 2403 can be provided by the word line capacitance from the memory array.

Figure 26:
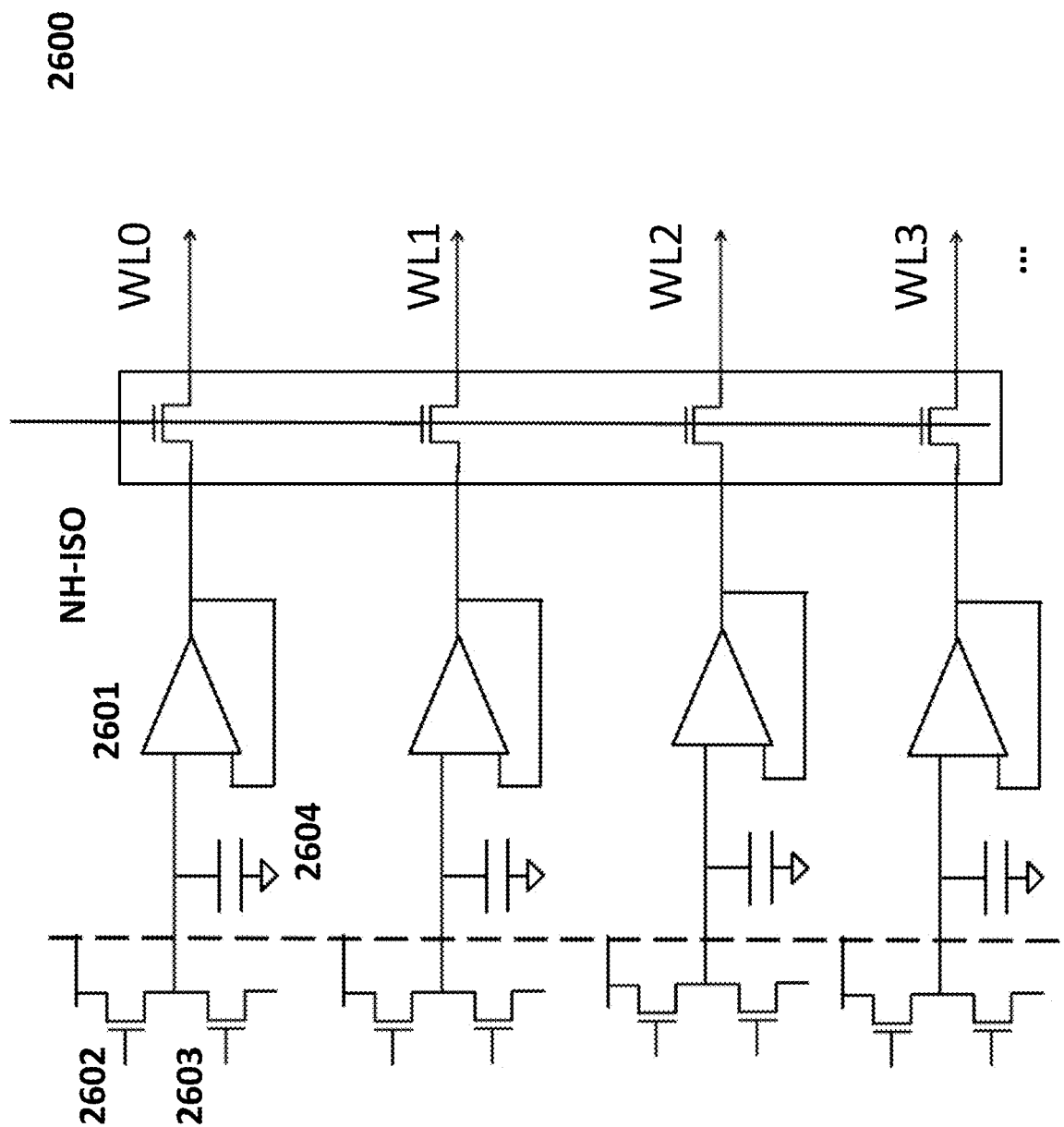
FIG. 26 depicts another embodiment of a word line driver for use with a vector multiplier matrix.

FIG. 26 depicts word line driver. Word line driver 2600 is similar to previously-described word line drivers except for the addition of amplifier 2601, which will acts as a voltage buffer for the voltage on the capacitor 2604 to drive the voltage into the wordline WL0, meaning that the voltage on the S/H capacitor will serve as a (floating) voltage source for the wordline. This is for example to avoid the wordline to wordline coupling from affecting the voltage on the capacitor.

Figure 27:
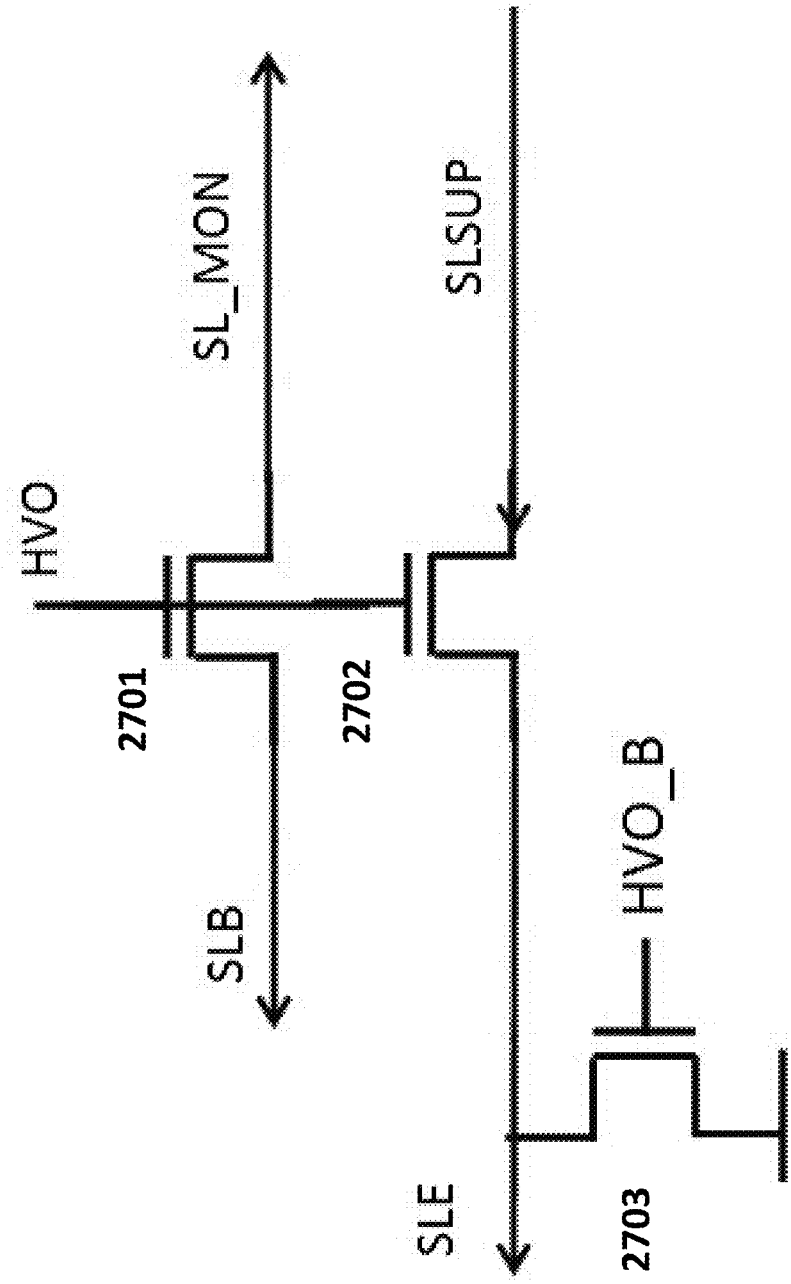
FIG. 27 depicts a source line decoder circuit for use with a vector multiplier matrix.

FIG. 27 depicts high voltage source line decoder circuit 2700. High voltage source line decoder circuit comprises transistors 2701, 2702, and 2703, configured as shown. Transistor 2703 is used to de-select the source line to a low voltage. Transistor 2702 is used to drive a high voltage into the source line of the array and transistor 2701 is used to monitor the voltage on the source line. Transistors 2702, 2701 and a driver circuit (such as an opa) is configured in a closed loop fashion (force/sense) to maintain the voltage over PVT (process, voltage, temperature) and varied current load condition. SLE (driven source line node) and SLB (monitored source line node) can be at the one end of a source line. Alternatively SLE can be at one end and SLN at the other end of a source line.

Figure 28:
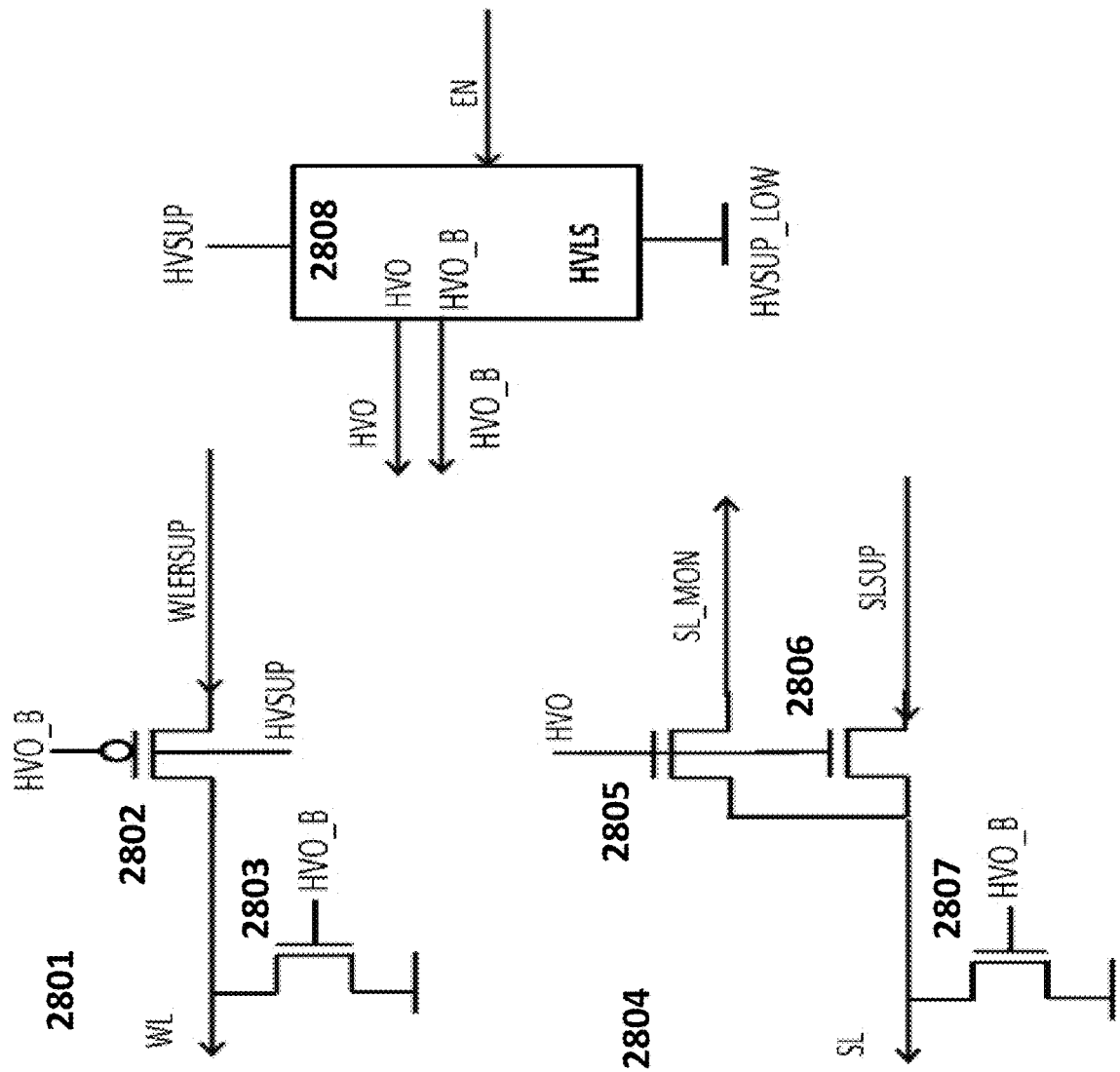
FIG. 28 depicts a word line decoder circuit, a source line decoder circuit, and a high voltage level shifter for use with a vector multiplier matrix.

FIG. 28 depicts VMM high voltage decode circuits, comprising word line decoder circuit 2801, source line decoder circuit 2804, and high voltage level shifter 2808, which are appropriate for use with memory cells of the type shown in FIG. 2.

Word line decoder circuit 2801 comprises PMOS select transistor 2802 (controlled by signal HVO_B) and NMOS de-select transistor 2803 (controlled by signal HVO_B) configured as shown.

Source line decoder circuit 2804 comprises NMOS monitor transistors 2805 (controlled by signal HVO), driving transistor 2806 (controlled by signal HVO), and de-select transistor 2807 (controlled by signal HVO_B), configured as shown.

High voltage level shifter 2808 received enable signal EN and outputs high voltage signal HV and its complement HVO_B.

Figure 29:
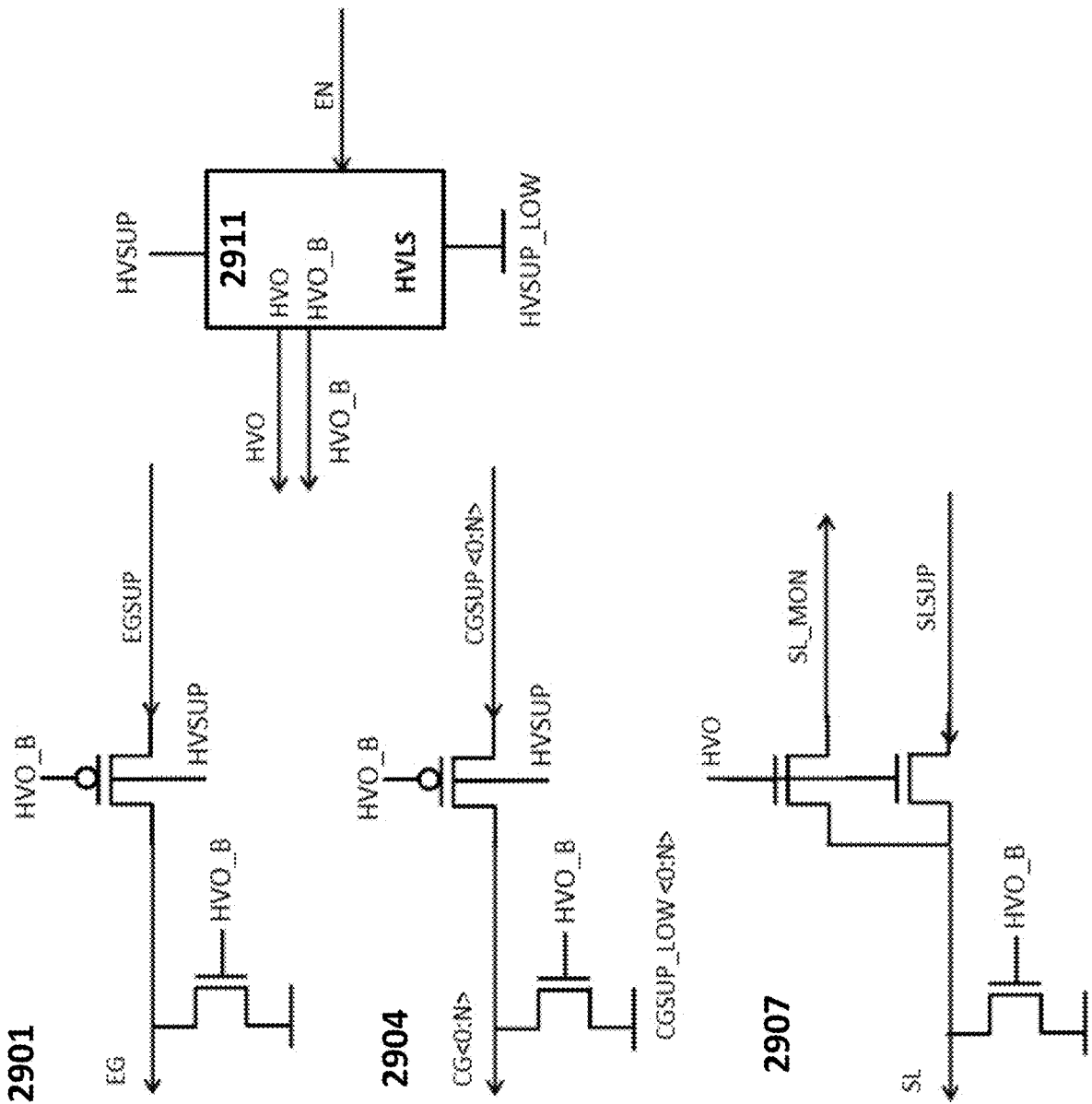
FIG. 29 depicts an erase gate decoder circuit, a control gate decoder circuit, a source line decoder circuit, and a high voltage level shifter for use with a vector multiplier matrix.

FIG. 29 depicts VMM high voltage decode circuits, comprising erase gate decoder circuit 2901, control gate decoder circuit 2904, source line decoder circuit 2907, and high voltage level shifter 2911, which are appropriate for use with memory cells of the type shown in FIG. 3.

Erase gate decoder circuit 2901 and control gate decoder circuit 2904 use the same design as word line decoder circuit 2801 in FIG. 28.

Source line decoder circuit 2907 uses the same design as source line decoder circuit 2804 in FIG. 28.

High voltage level shifter 2911 uses the same design as high voltage level shifter 2808 in FIG. 28.

Figure 30:
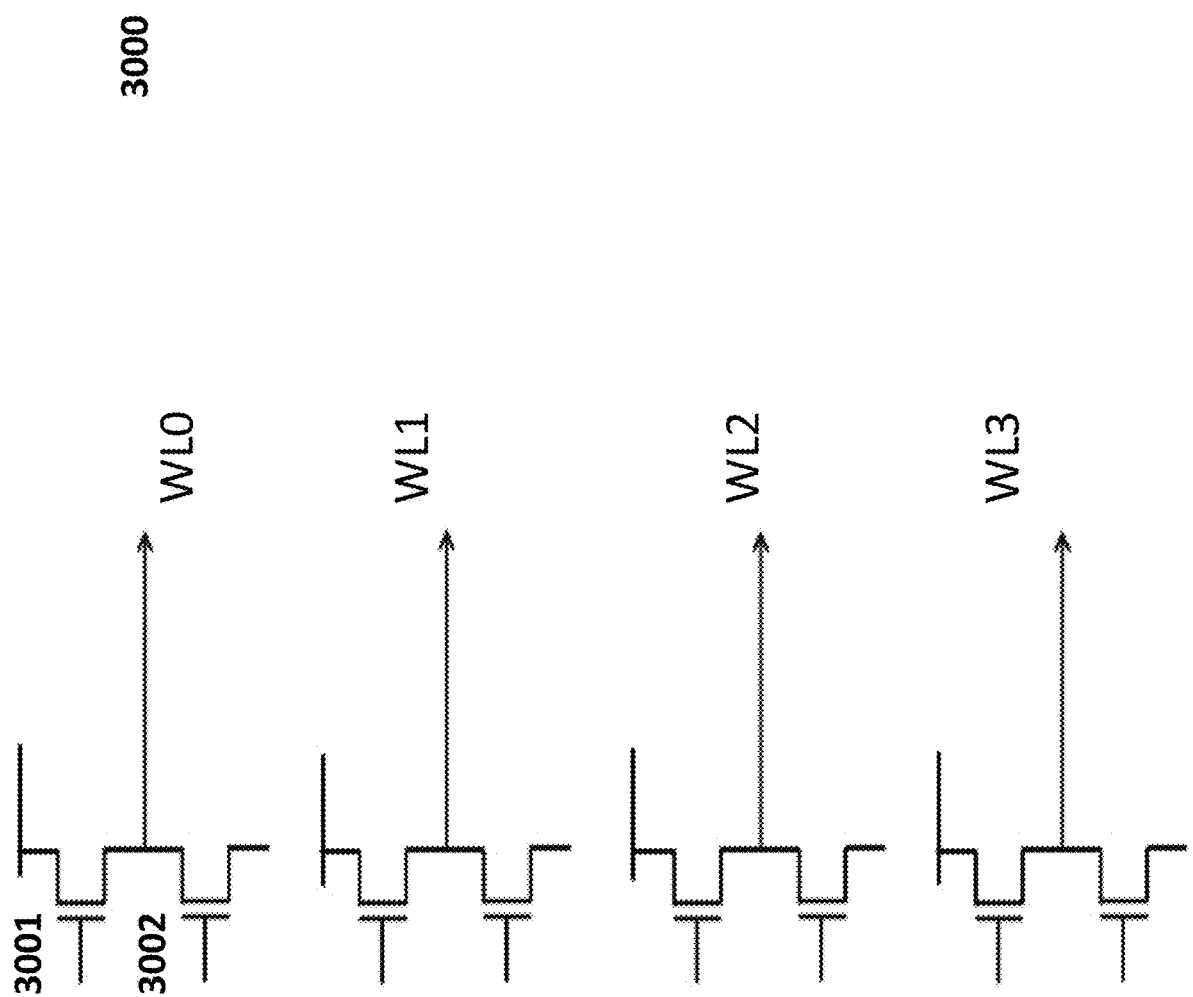
FIG. 30 depicts a word line decoder circuit for use with a vector multiplier matrix.

FIG. 30 depicts word line decoder 300 for exemplary word lines WL0, WL1, WL2, and WL3. Exemplary word line WL0 is coupled to pull-up transistor 3001 and pull-down transistor 3002. When pull-up transistor 3001 is activated, WL0 is enabled. When pull-down transistor 3002 is activated, WL0 is disabled. The function of FIG. 30 is similarly to that of the FIG. 21 without the isolation transistors.

Figure 31:
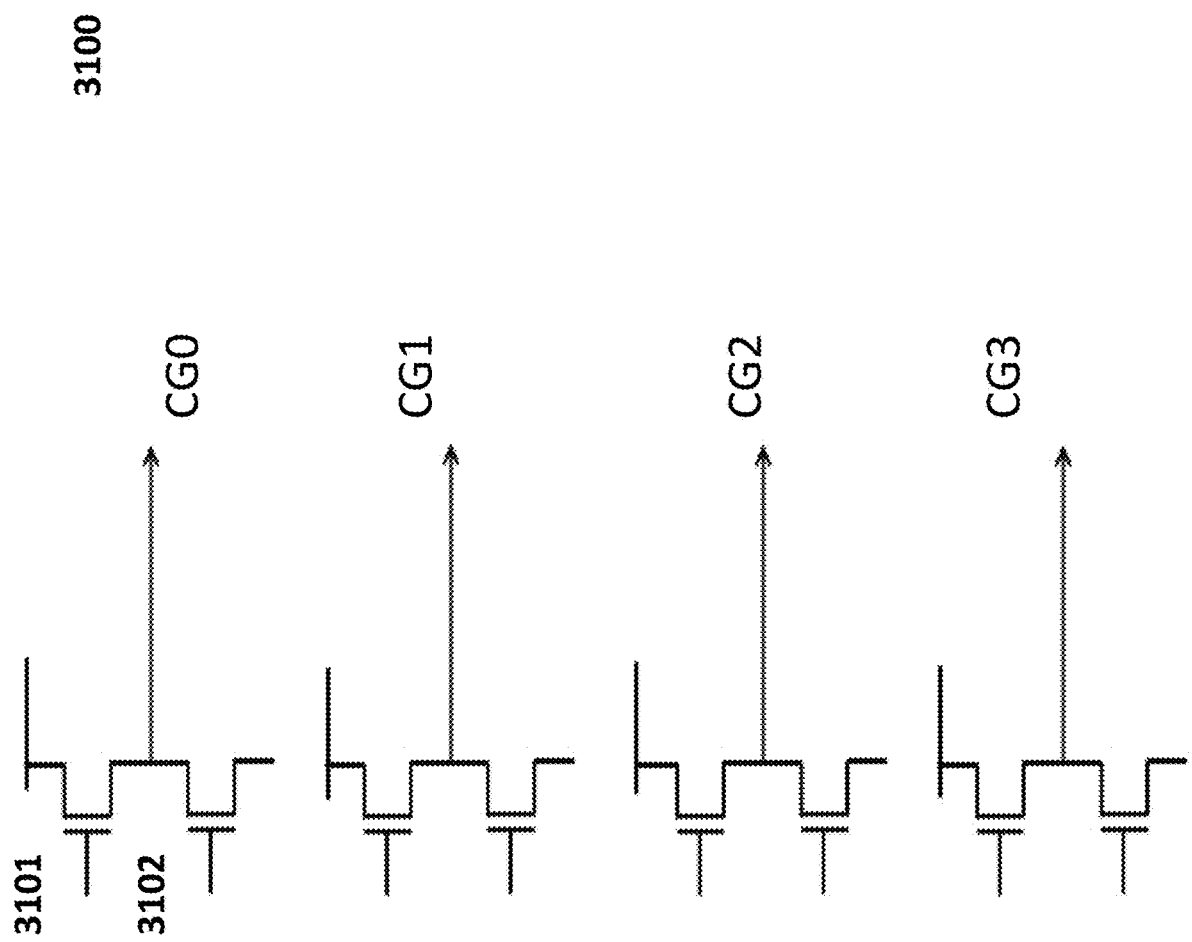
FIG. 31 depicts a control gate decoder circuit for use with a vector multiplier matrix.

FIG. 31 depicts control gate decoder 3100 for exemplary control gate lines CG0, CG1, CG2, and CG3. Exemplary control gate line CG0 is coupled to pull-up transistors 3101 and pull-down transistor 3102. When pull-up transistor 3101 is activated, CG0 is enabled. When pull-down transistor 3102 is activated, CG0 is disabled. The select and de-selection function of FIG. 31 is similarly to that of the FIG. 30 for the control gates.

Figure 32:
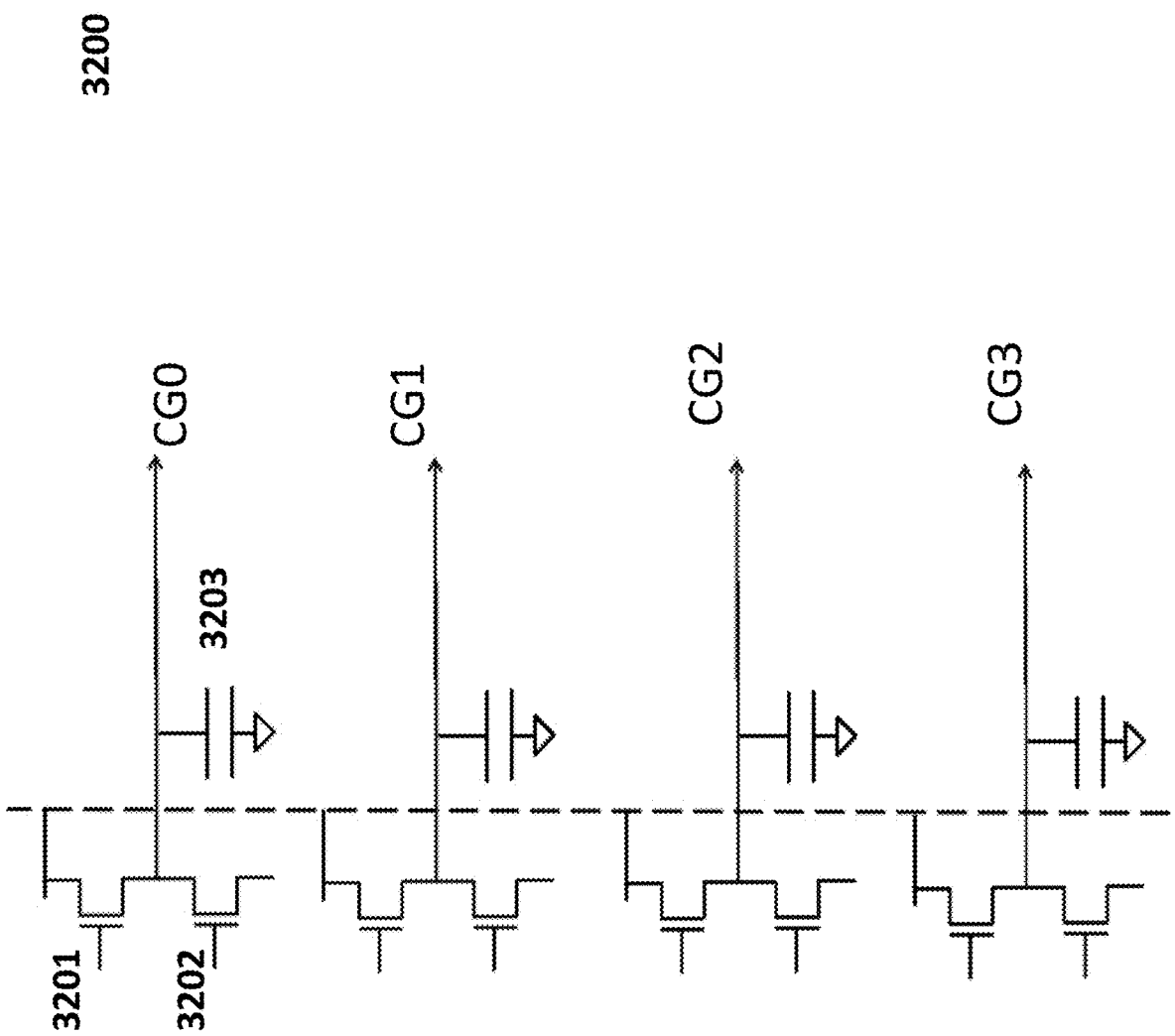
FIG. 32 depicts another control gate decoder circuit for use with a vector multiplier matrix.

FIG. 32 depicts control gate decoder 3200 for exemplary control gate lines CG0, CG1, CG2, and CG3. Control gate decoder 3200 is similar to control gate decoder 3100 except that control gate decoder 3200 contains a capacitor, such as capacitor 3203, coupled to each control gate line. These sample and hold (S/H) capacitors can provide a pre-charge bias on each control gate line prior to an operation, meaning that the voltage on the S/H capacitor will serve as a (floating) voltage source for the control gate lines. The S/H capacitor can be provided by the control gate capacitance from memory cell.

Figure 33:
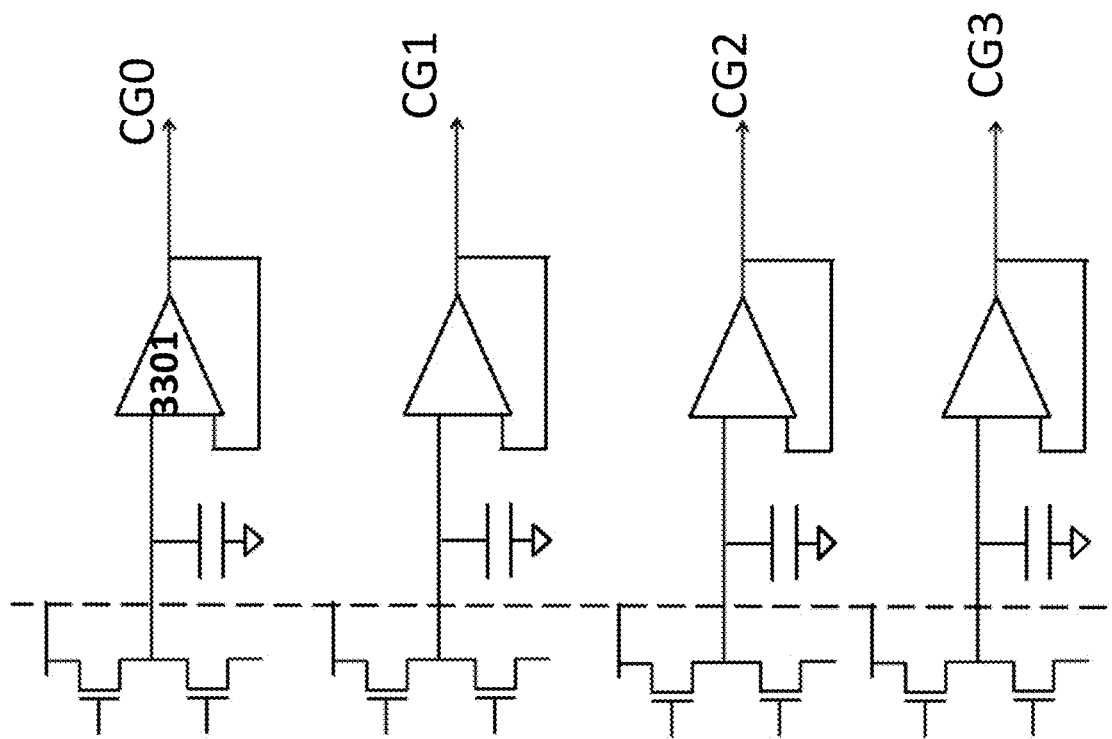
FIG. 33 depicts another control gate decoder circuit for use with a vector multiplier matrix.

FIG. 33 depicts control gate decoder 3300 for exemplary control gate lines CG0, CG1, CG2, and CG3. Control gate decoder 3300 is similar to control gate decoder 3200 except that control gate decoder 3300 further comprises a buffer 3301 (such as an opa).

Figure 34:
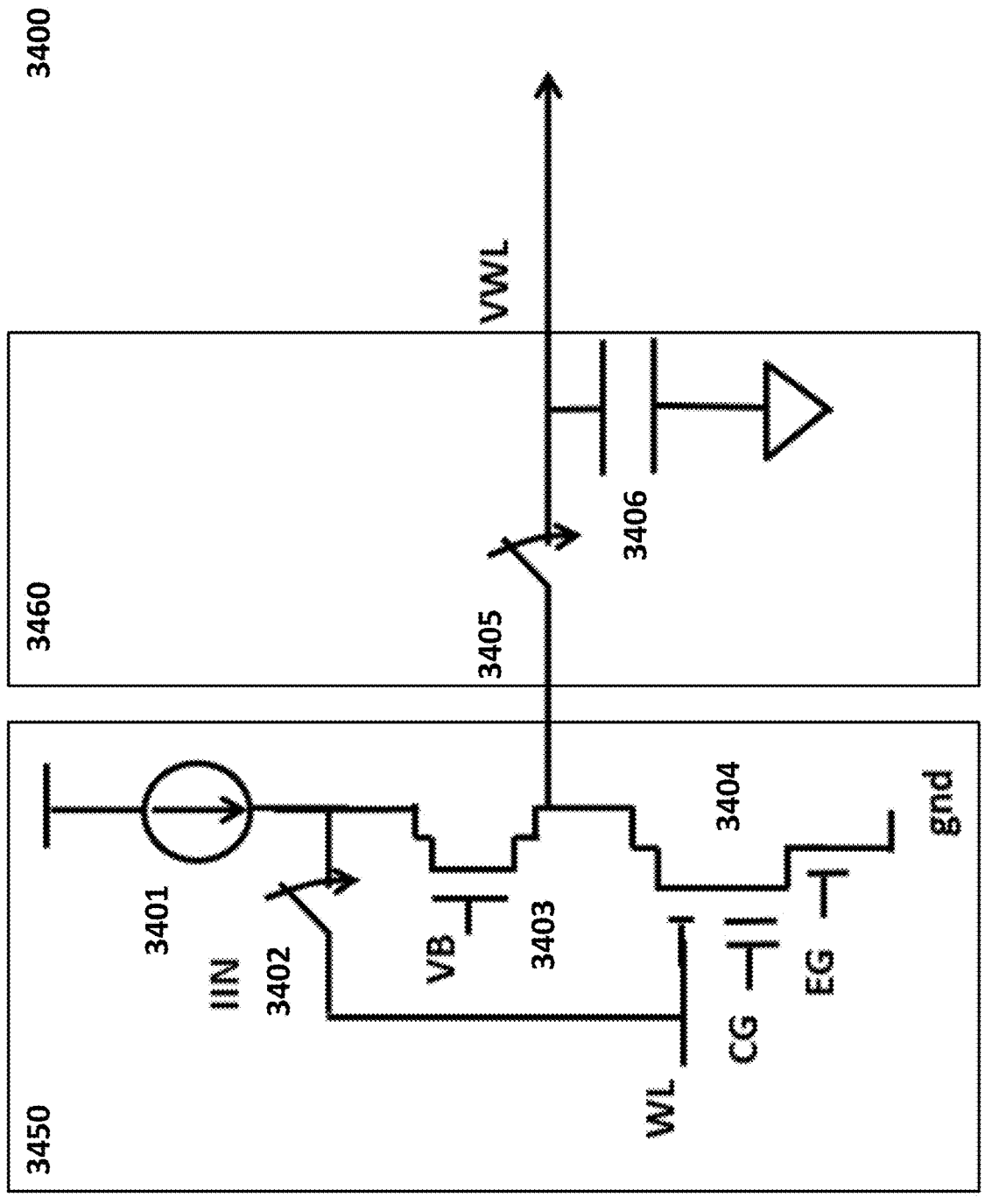
FIG. 34 depicts a current-to-voltage circuit for controlling a word line in a vector multiplier matrix.

FIG. 34 depicts current-to-voltage circuit 3400. The circuit comprises a configured diode connected reference cell circuit 3450 and a sample and hold circuit 3460. The circuit 3450 comprises input current source 3401, NMOS transistor 3402, cascoding bias transistor 3403, and reference memory cell 3404. The sample and hold circuit consists of switch 3405, and S/H capacitor 3406. The memory 3404 is biased in a diode connected configuration with a bias on its bit line to convert the input current into a voltage, such as for supplying the word line.

Figure 35:
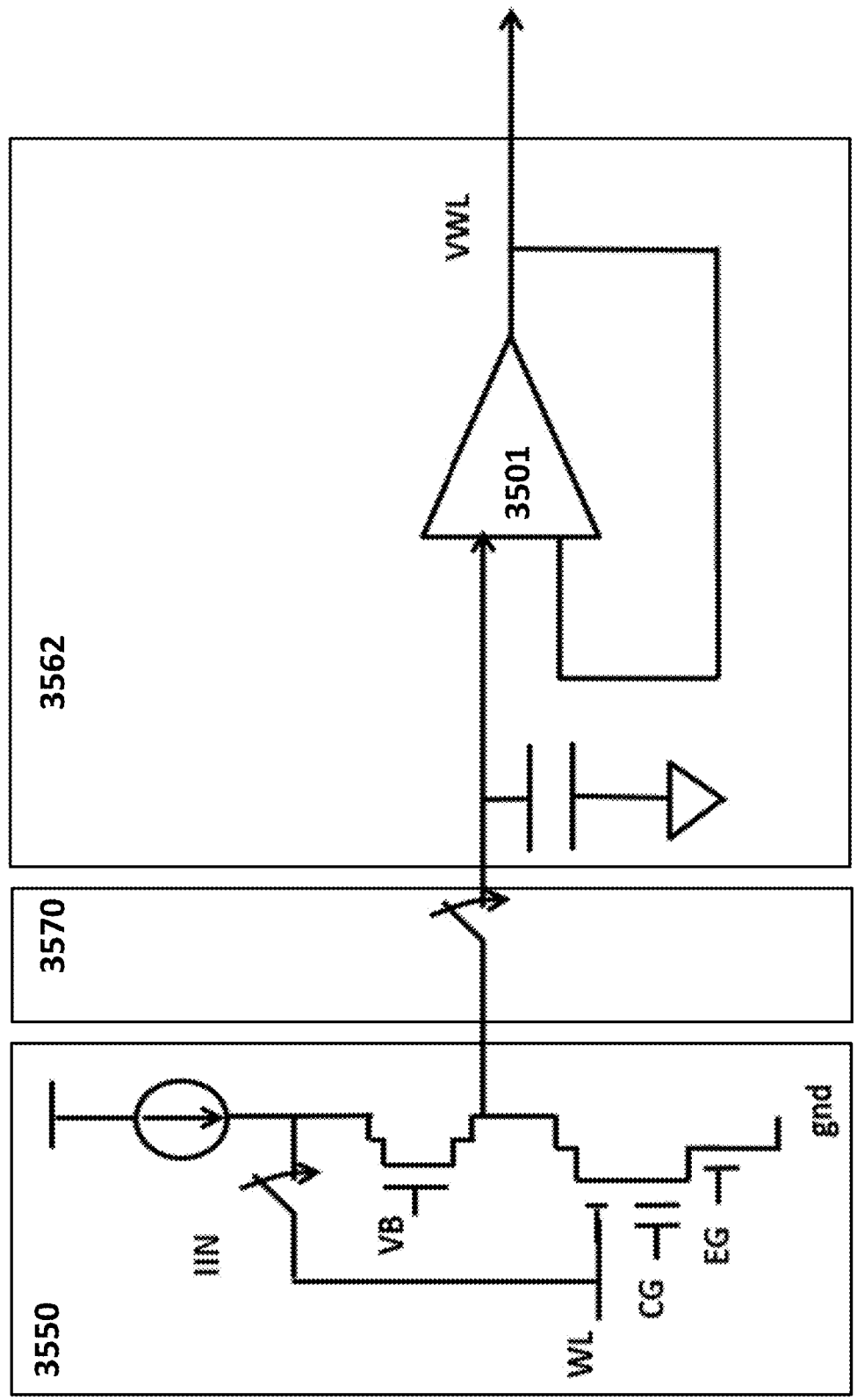
FIG. 35 depicts another current-to-voltage circuit for controlling a word line in a vector multiplier matrix.

FIG. 35 depicts current-to-voltage circuit 3500, which is similar to current-to-voltage circuit 3400 with the addition of amplifier 3501 after the S/H capacitor. Current-to-voltage circuit 3500 comprises a configured diode connected reference cell circuit 3550, sample and hold circuit 3470, and amplifier stage 3562.

Figure 36:
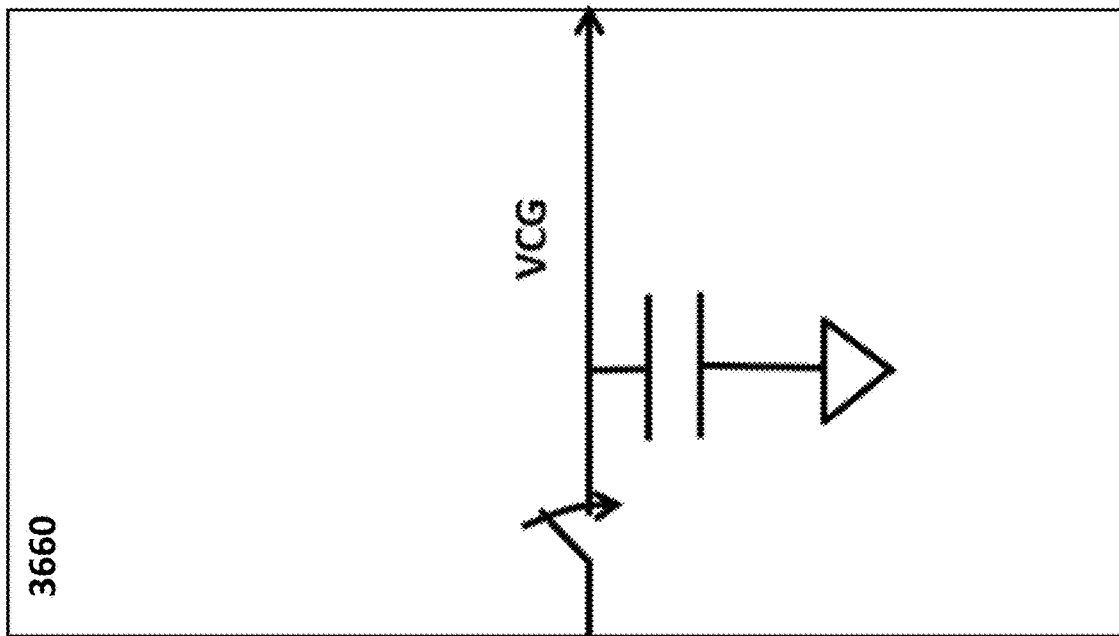
FIG. 36 depicts a current-to-voltage circuit for controlling a control gate line in a vector multiplier matrix.
Figure 36:
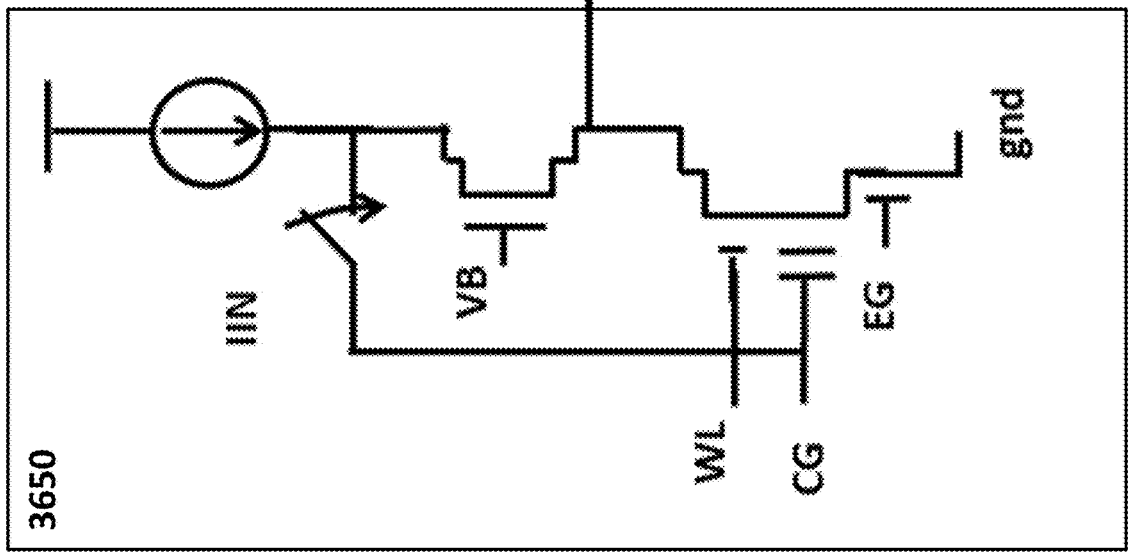

FIG. 36 depicts current-to-voltage circuit 3600, which is the same design as current-to-voltage circuit 3400 for the control gate in a diode connected configuration. Current-to-voltage circuit 3600 comprises a configured diode connected reference cell circuit 3650 and a sample and hold circuit 3660.

Figure 37:
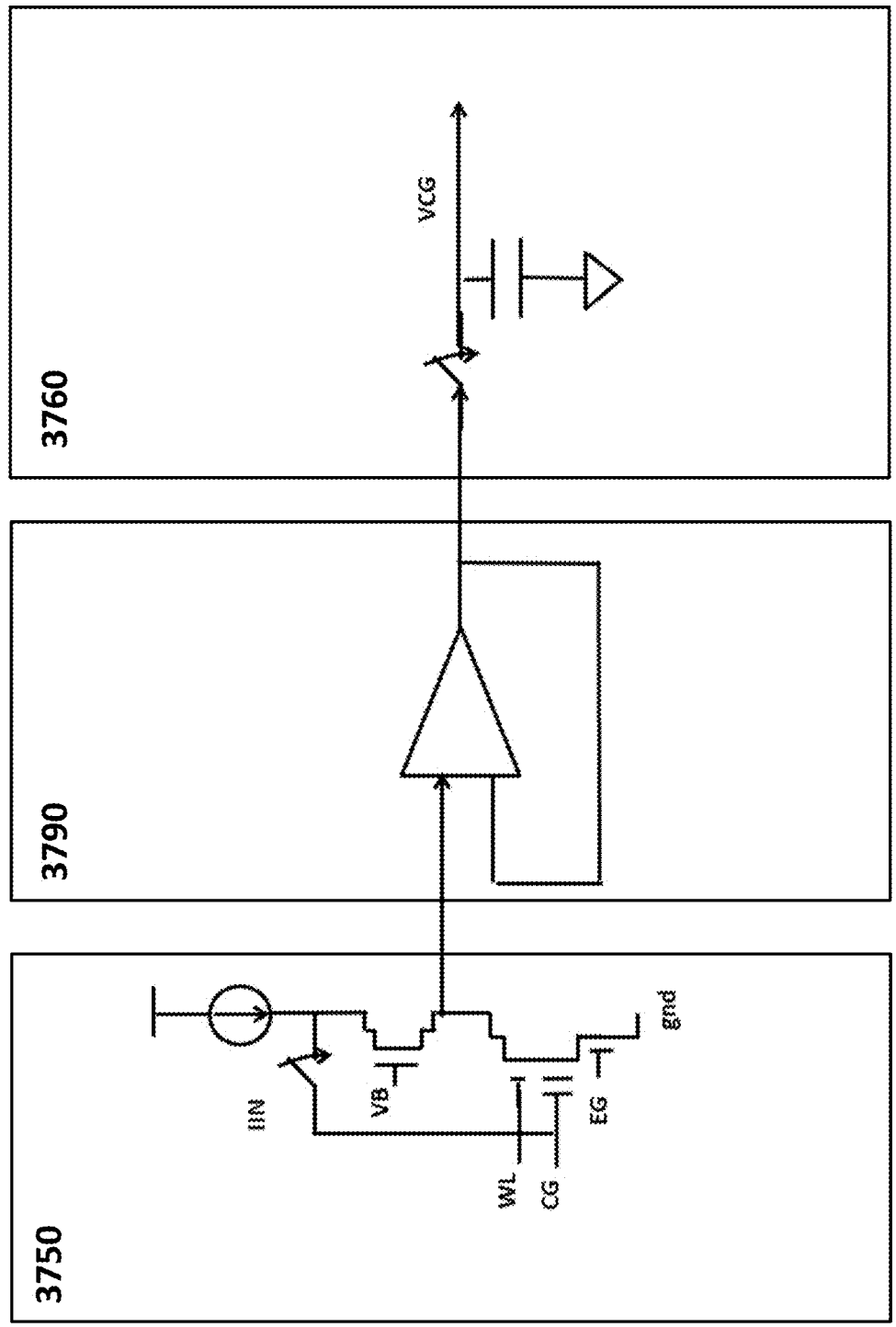
FIG. 37 depicts another current-to-voltage circuit for controlling a control gate line in a vector multiplier matrix.

FIG. 37 depicts current-to-voltage circuit 3700, in which a buffer 3790 is placed between reference circuit 3750 and the S/H circuit 3760.

Figure 38:
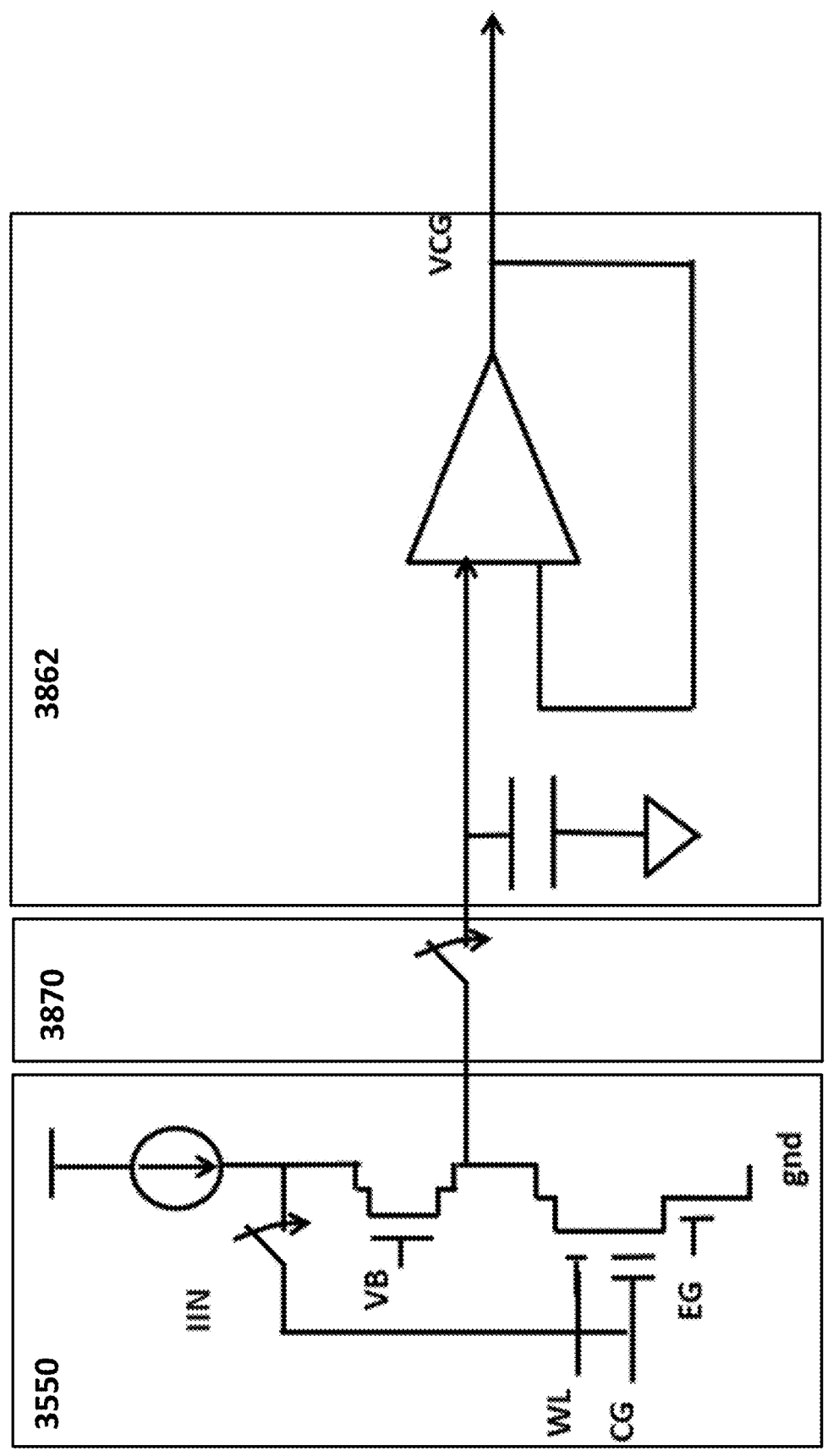
FIG. 38 depicts another current-to-voltage circuit for controlling a control gate line in a vector multiplier matrix.

FIG. 38 depicts current-to-voltage circuit 3800 which is similar to FIG. 35 with a control gate connected in a diode connected configuration. Current-to-voltage circuit 3800 comprises a configured diode connected reference cell circuit 3550, sample and hold circuit 3870, and amplifier stage 3862.

Figure 39:
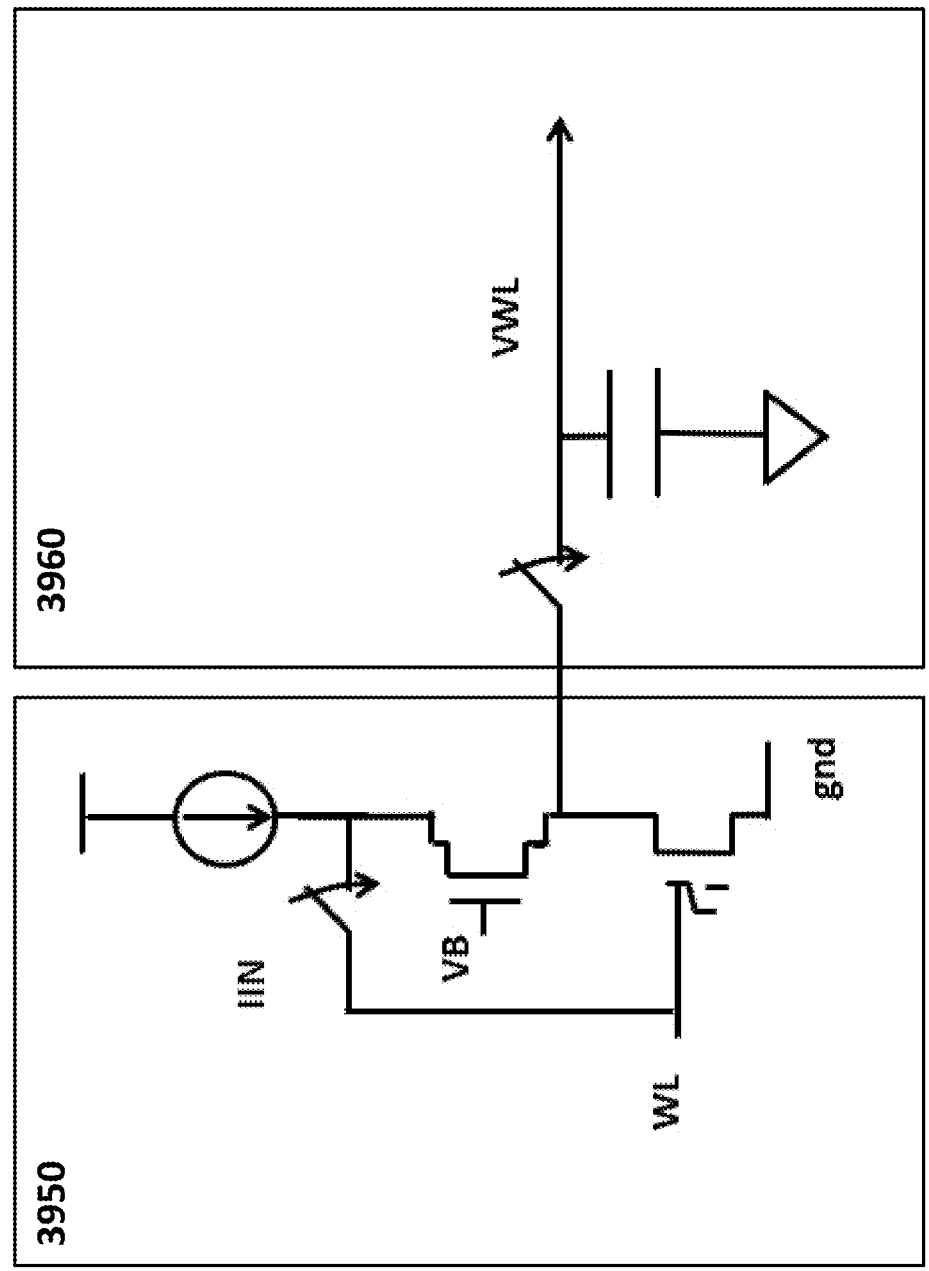
FIG. 39 depicts another current-to-voltage circuit for controlling a word line in a vector multiplier matrix.

FIG. 39 depicts current-to-voltage circuit 3900 which is similar to FIG. 34 as applied to memory cell in FIG. 2. Current-to-voltage circuit 3900 comprises a configured diode connected reference cell circuit 3950 and a sample and hold circuit 3960.

Figure 40:
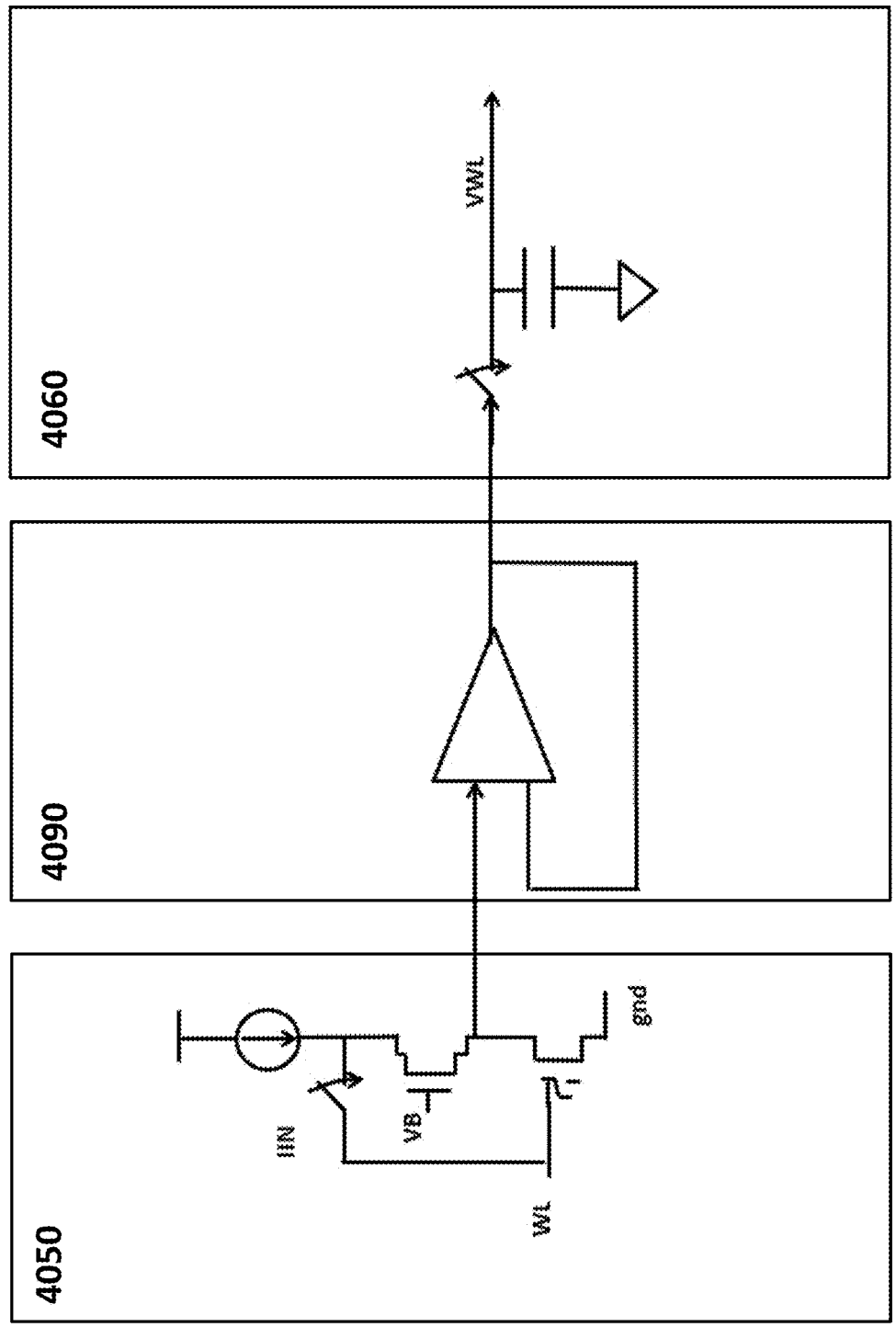
FIG. 40 depicts another current-to-voltage circuit for controlling a word line in a vector multiplier matrix.

FIG. 40 depicts current-to-voltage circuit 4000 which is similar to FIG. 37 as applied to memory cell in FIG. 2, in which a buffer 4090 is placed between reference circuit 4050 and the S/H circuit 4060.

Figure 41:
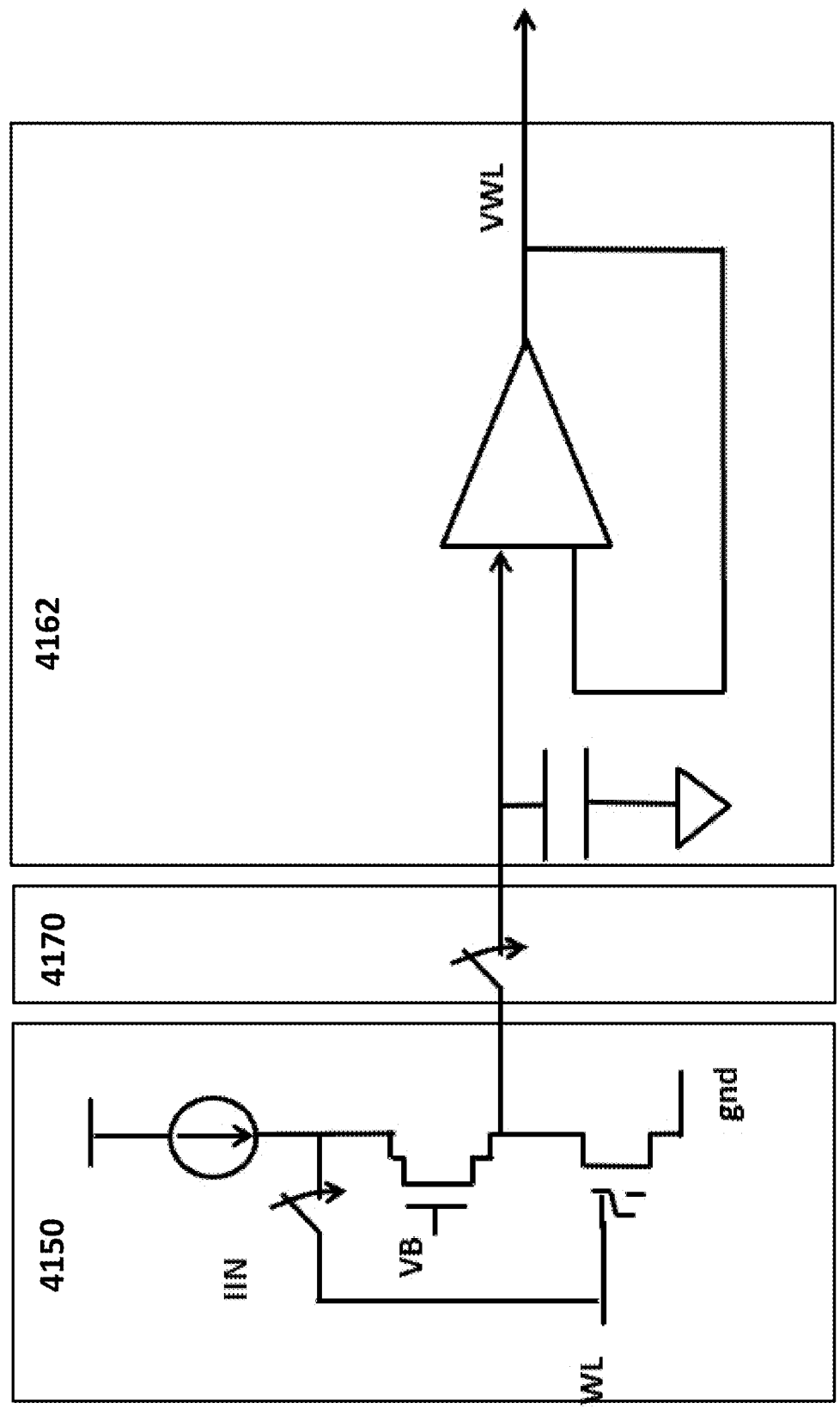
FIG. 41 depicts another current-to-voltage circuit for controlling a word line in a vector multiplier matrix.

FIG. 41 depicts current-to-voltage circuit 4100 which is similar to FIG. 38 as applied to memory cell in FIG. 2. Current-to-voltage circuit 4100 comprises a configured diode connected reference cell circuit 4150, sample and hold circuit 4170, and amplifier stage 4162.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A system comprising:
  a vector-by-matrix multiplication array comprising an array of non-volatile memory cells organized into rows and columns, wherein respective ones of the columns are connected to a respective bit line and
  a bit line decoder circuit coupled to the respective bit lines, the bit line decoder comprising:
    a first column decoder for enabling an individual bit line during a program-and-verify operation of a non-volatile memory cell coupled to the individual bit line; and
    a second column decoder for enabling a plurality of bit lines during an analog neuromorphic neuron read operation.

2. The system of claim 1, wherein the second column decoder comprises a plurality of select transistors and a plurality of activation function circuits respectively coupled to the plurality of bit lines.

3. The system of claim 2, wherein gates of the plurality of select transistors are coupled to the same control line.

4. The system of claim 1, wherein a negative bias is applied to word lines coupled respectively to rows containing unselected memory cells during the program-and-verify operation or a read operation of the non-volatile memory cell coupled to the individual bit line.

5. The system of claim 1, wherein the non-volatile memory cells are split-gate flash memory cells.

6. The system of claim 1, wherein the non-volatile memory cells are stacked-gate flash memory cells.

7. The system of claim 1, wherein the non-volatile memory cells are configured to operate in a sub-threshold region.

8. The system of claim 1, wherein the non-volatile memory cells are configured to operate in a linear region.

9. The system of claim 2, wherein a negative bias is applied to gates of select transistors coupled to non-enabled bit lines during the program-and-verify operation or a read operation.

10. A system comprising:
a vector-by-matrix multiplication array comprising an array of non-volatile memory cells organized into rows and columns, wherein respective ones of the columns are connected to a respective bit line; and
a bitline decoder circuit, wherein the bitline decoder circuit enables an individual bit line in the vector-by-matrix multiplication array during a program-and-verify operation and enables a plurality of bit lines in the vector-by-matrix multiplication array during an analog neuromorphic neuron read operation.

11. The system of claim 10, wherein the bitline decoder circuit comprises a plurality of select transistors and a plurality of activation function circuits coupled to the plurality of bit lines.

12. The system of claim 10, wherein a negative bias is applied to word lines coupled respectively to rows containing unselected memory cells during the program-and-verify operation or a read operation.

13. The system of claim 10, wherein the non-volatile memory cells are split-gate flash memory cells.

14. The system of claim 10, wherein the non-volatile memory cells are stacked-gate flash memory cells.

15. The system of claim 10, wherein the non-volatile memory cells are configured to operate in a sub-threshold region.

16. The system of claim 10, wherein the non-volatile memory cells are configured to operate in a linear region.

17. The system of claim 11, wherein a negative bias is applied to gates of select transistors coupled to respective non-enabled bit lines during the program-and-verify operation or a read operation.

* * * * *